US011632870B2

(12) United States Patent
Tan et al.

(10) Patent No.: US 11,632,870 B2
(45) Date of Patent: Apr. 18, 2023

(54) CAGE AND ELECTRONIC DEVICE FOR ADD-ON CARD

(71) Applicant: WISTRON CORP., New Taipei (TW)

(72) Inventors: Siyun Tan, New Taipei (TW); Qi Liu, New Taipei (TW)

(73) Assignee: WISTRON CORP., New Taipei (TW)

( * ) Notice: Subject to any disclaimer, the term of this patent is extended or adjusted under 35 U.S.C. 154(b) by 309 days.

(21) Appl. No.: 17/080,883

(22) Filed: Oct. 27, 2020

(65) Prior Publication Data

US 2022/0087044 A1   Mar. 17, 2022

(30) Foreign Application Priority Data

Sep. 11, 2020   (CN) .......................... 202010952826.3

(51) Int. Cl.
*H05K 7/00* (2006.01)
*H05K 7/14* (2006.01)

(52) U.S. Cl.
CPC ......... *H05K 7/1424* (2013.01); *H05K 7/1415* (2013.01)

(58) Field of Classification Search
CPC .......................... H05K 7/1424; H05K 7/1415
See application file for complete search history.

(56) References Cited

U.S. PATENT DOCUMENTS

| 3,197,731 | A | * | 7/1965 | Beale | H05K 7/1425 211/41.17 |
| 4,840,570 | A | * | 6/1989 | Mann, Jr. | H05K 7/1461 439/372 |
| 2008/0094810 | A1 | * | 4/2008 | Lajara | G06F 1/185 361/759 |
| 2013/0088831 | A1 | * | 4/2013 | Zheng | H05K 7/1424 361/679.43 |
| 2020/0133354 | A1 | * | 4/2020 | Pena | G06F 1/186 |
| 2022/0061181 | A1 | * | 2/2022 | Baldwin, Jr. | G06F 1/183 |

FOREIGN PATENT DOCUMENTS

TW           I717120 B      1/2021

OTHER PUBLICATIONS

TW 202121956A English Translation (Year: 2019).*
TW Office Action dated Mar. 8, 2022 in Taiwan application No. 109131899.

* cited by examiner

*Primary Examiner* — Pete T Lee
(74) *Attorney, Agent, or Firm* — McClure, Qualey & Rodack, LLP

(57) ABSTRACT

The disclosure relates to a cage and an electrical device having the same, where the cage is configured to accommodate at least one expansion card and includes a cage body, a rail, and at least one holder. The cage body is configured to accommodate the at least one expansion card. The rail is fixed on the cage body. The rail has a groove configured for an insertion of the at least one expansion card. The at least one holder is movably disposed on the cage body. Part of the at least one holder is removably located in the groove. The at least one holder is configured to block the at least one expansion card in the groove.

21 Claims, 24 Drawing Sheets

CAGE AND ELECTRONIC DEVICE FOR ADD-ON CARD

CROSS-REFERENCE TO RELATED APPLICATIONS

This non-provisional application claims priority under 35 U.S.C. § 119(a) on Patent Application No(s). 202010952826.3 filed in China on Sep. 11, 2020, the entire contents of which are hereby incorporated by reference.

TECHNICAL FIELD

The disclosure relates to a cage, more particularly to a cage and an electronic device for expansion card.

BACKGROUND

With the development of technology, computers and server systems can meet various demands by expanding or upgrading functionalities. Take a server as an example, installing or upgrading an expansion card or expansion card, such as a display card or network interface card, is a common approach to add required functionality to the server system.

The expansion cards can be added to the system through a riser cage. Specifically, a typical riser cage provides slots that allow adding one or more expansion cards to the server system so that the riser cage can arrange the expansion cards in place in the server casing. To prevent the expansion card from disengaging from the slot due to vibration or sudden impact, the riser cage usually has a fixing mechanism thereon. One of the typical fixing mechanisms is a frame having one end pivotably fixed to one side of the cage and the other end detachably engaged to the other side of the cage; when the frame is closed, the frame can provide pressure to the expansion card so as to hold it in position. However, this solution is still considered to be complex in configuration, and it involves inconvenient operating steps and takes up a large space when operating and therefore is not suitable for the limited and compact internal space of the server.

SUMMARY

Accordingly, the present disclosure provides a cage and an electronic device having the same that can secure the position of the expansion card using a simple configuration that occupies a small space when operating.

One embodiment of the disclosure provides a cage configured to accommodate at least one expansion card. The cage includes a cage body, a rail, and at least one holder. The cage body is configured to accommodate the at least one expansion card. The rail is fixed on the cage body. The rail has a groove configured for an insertion of the at least one expansion card. The at least one holder is movably disposed on the cage body. Part of the at least one holder is removably located in the groove. The at least one holder is configured to block the at least one expansion card in the groove.

Another embodiment of the disclosure provides an electronic device configured to accommodate at least one expansion card. The electronic device includes a casing and a cage. The cage includes a cage body, a rail, and at least one holder. The cage body is configured to accommodate the at least one expansion card. The rail is fixed on the cage body. The rail has a groove configured for an insertion of the at least one expansion card. The at least one holder is movably disposed on the cage body. Part of the at least one holder is removably located in the groove. The at least one holder is configured to block the at least one expansion card in the groove.

According to the cage and the electronic device as discussed in the above embodiments of the disclosure, the rail on the cage body of the cage only allows the expansion card to move along the groove while the holder that can stop the movement of the expansion card is arranged in the groove, such that the cage can provide multidirectional restrictions to the expansion card thereon so as to effectively prevent the expansion card from moving due to vibration or sudden impact, thereby ensuring the electrical connection of the expansion card.

As such, the cage is able to secure the position of the expansion card using a simple configuration that only involves simple operating steps and occupies a small space when operating.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
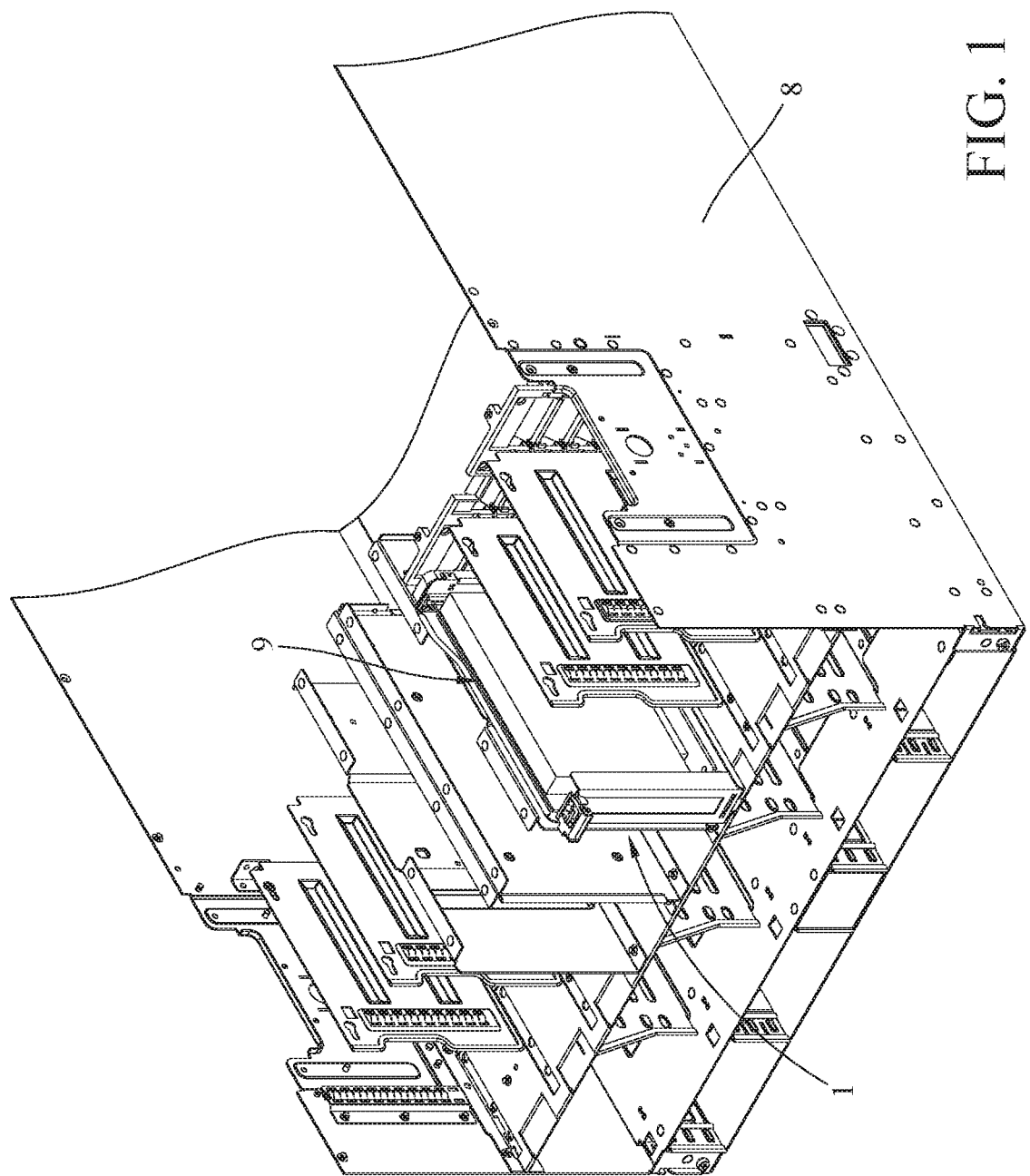
FIG. 1 is a perspective view of a cage for expansion card and a casing having the same according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details.

The following embodiments will be described with reference to the drawings. For the purpose of clear illustration, some conventional elements and components may be illustrated in a simple and clear manner. Some of the features in the drawings may be slightly exaggerated or illustrated in a larger proportion for the ease of viewing but are not intended to limit the disclosure. In addition, for the same reason, some of the elements or components in the drawings may be illustrated in dotted lines.

Herein, the terms, such as "end", "part", "portion", "area", may be used to refer to specific features of or between elements or components but are not intended to limit the elements and components. In addition, the terms, such as "substantially" and "approximately", as used herein may mean a reasonable amount of deviation of the described term such that the end result is not significantly changed.

Further, unless explicitly stated, the term "at least one" as used herein may mean that the quantity of the described element or component is one or larger than one but does not necessarily mean that the quantity is only one. The term "and/or" may be used herein to indicate that either or both of two stated possibilities.

Figure 2:
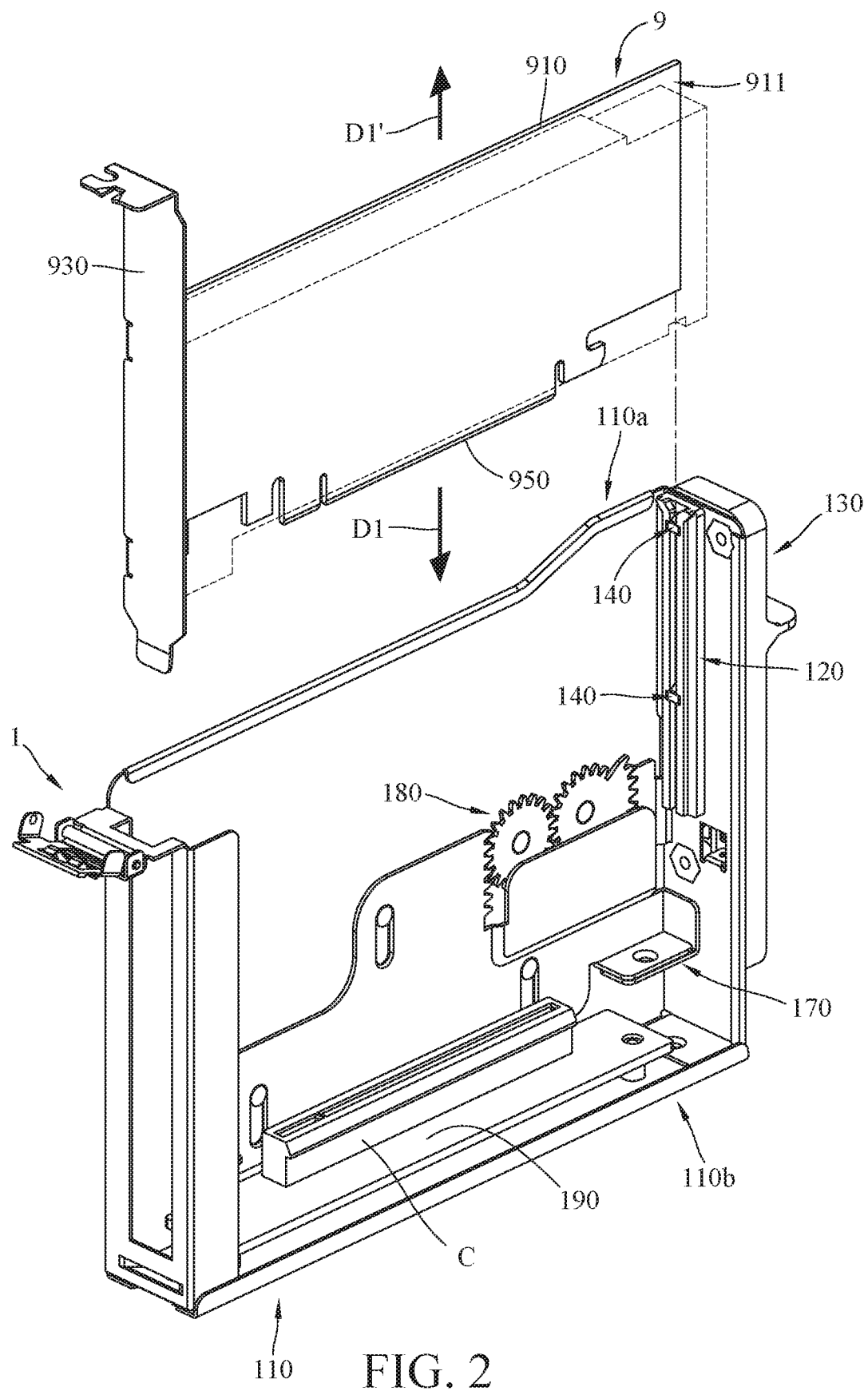
FIG. 2 is an exploded perspective view of the cage according to one embodiment of the disclosure and an expansion card applicable thereto.

Firstly, referring to FIGS. 1-2, one embodiment of the disclosure provides an electronic device. As shown, the electronic device may include a casing 8 and at least one cage 1 disposed in the casing 8. The casing 8 is, but not limited to, a server casing, other types of computer casing, or a chassis that can be accommodated in a server casing. For the purpose of simple illustration, the drawings may only illustrate part of the casing 8 and the electrical/non-electrical components irrelevant to the spirit of the disclosure, such as cables, fans, and other casings, are simplified or omitted from the drawings. For the same purpose, only one cage 1 is illustrated in the casing 8, however, the quantity of the cage 1 that the casing 8 can accommodate may be modified according to actual requirements.

The cage 1 is configured for the installation of at least one expansion card 9 to the casing 8. As shown, the cage 1 has an I/O board 190 having at least one connector C configured for electrical connection to the expansion card 9. The expansion card 9 is, but not limited to, a display card or a network interface card, depending on the actual requirements. Generally, the expansion card 9 includes a circuit board 910, a bracket 930, and an edge connector 950. The simple block (not numbered) illustrated in dotted lines on the circuit board 910 represents the electrical components of the expansion card 9 that can provide the required function to the system but is not intended to limit the disclosure. The bracket 930 and the edge connector 950 are located at different sides of the circuit board 910, respectively. In this embodiment, the edge connector 950 is a PCI Express edge connector and is adapted to be plugged into the connector C of the cage 1. The bracket 930 is configured to be fixed to a side of the cage 1 when the edge connector 950 is connected to the connector C.

Generally, a PCI-Express expansion card has an area, along the edges of its circuit board, having no electrical component or trace thereon. As shown, there is at least one trace free area (also called "idle area") 911 arranged along the edge of the circuit board 910 opposite to the bracket 930, and there is no electrical component or trace arranged in the range of the trace free area 911. However, the expansion card 9 is exemplary and merely for the ease of understanding the disclosure, and the disclosure is not limited by the type and configuration of the expansion card that the cage 1 can accommodate.

The cage 1 is able to restrict the moving direction of the expansion card 9 thereon; specifically, the cage 1 only permits the expansion card 9 moving along an insertion or a removal direction. As shown, the expansion card 9 can be inserted into the cage 1 along an insertion direction (e.g., a direction D1) or removed from the cage 1 along a removal direction (e.g., a direction D1' opposite to the direction D1), but the add-on cage 9 is not allowed to move in other directions. In this embodiment, at least one holder 140 is arranged on the cage 1 to prevent the edge connector 950 of the expansion card 9 from being disconnected from the connector C while the cage 1 experiencing vibration or sudden impact. Each of the holders 140 is movable in directions different from the insertion/removal direction of the expansion card 9 so as to effectively secure the position of the expansion card 9 and the electrical connection of the expansion card 9 to the connector C.

Figure 3:
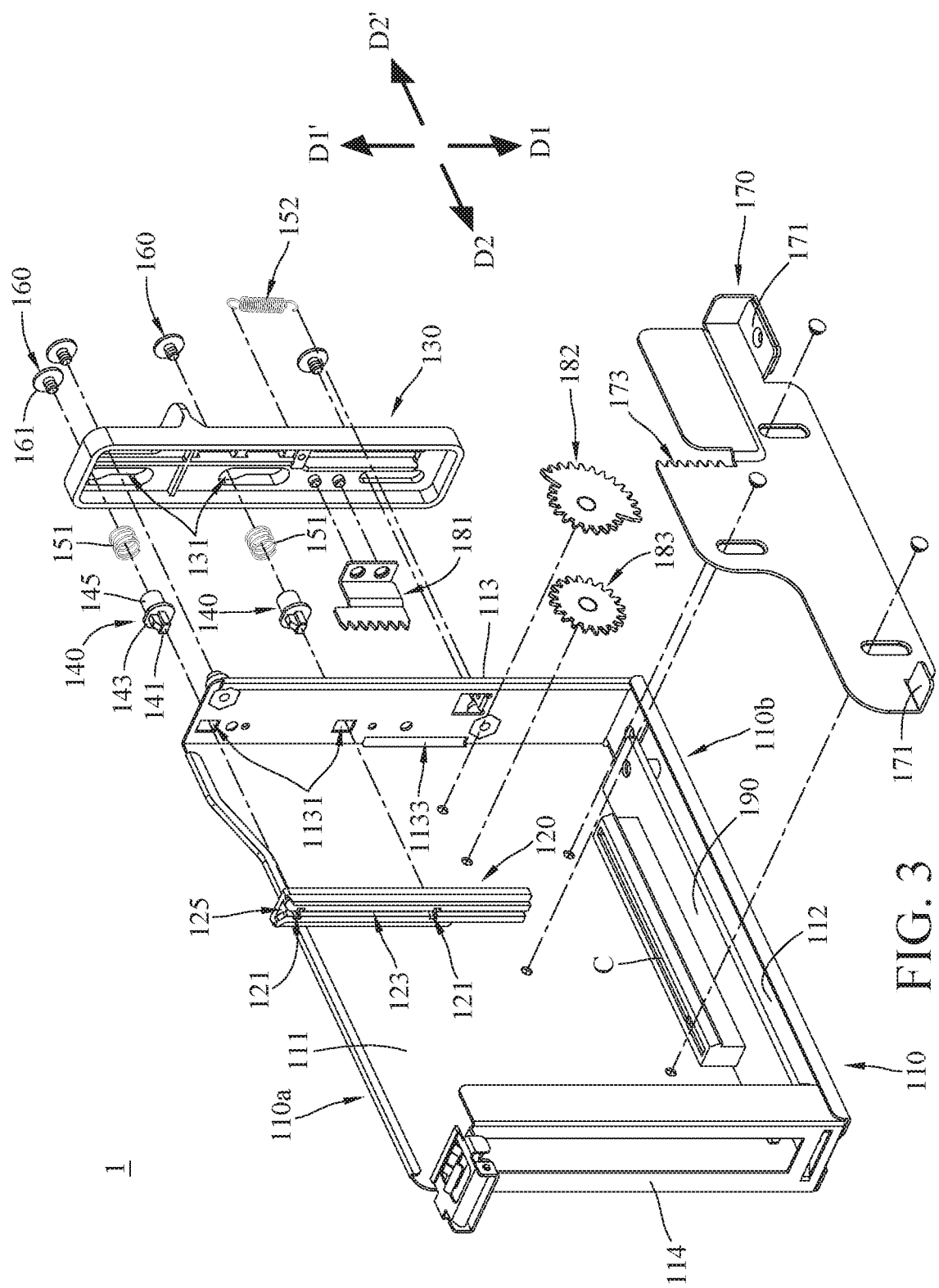
FIG. 3 is an exploded view of the cage in FIG. 2.
Figure 4:
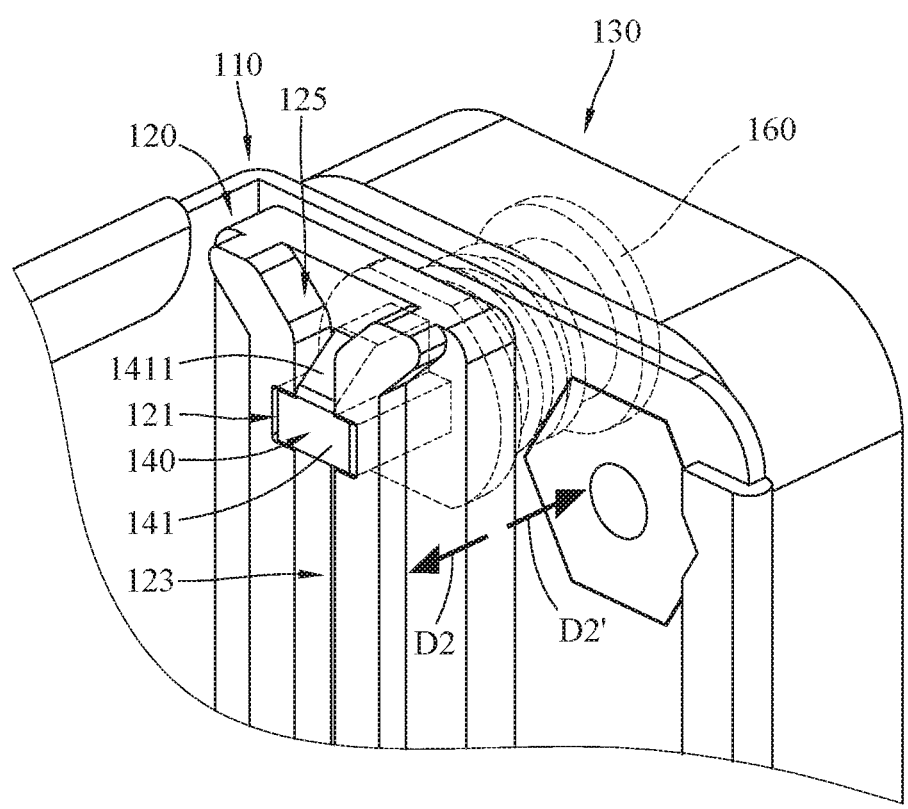
FIG. 4 is a partial enlarged perspective view of the cage in FIG. 2.
Figure 5A:
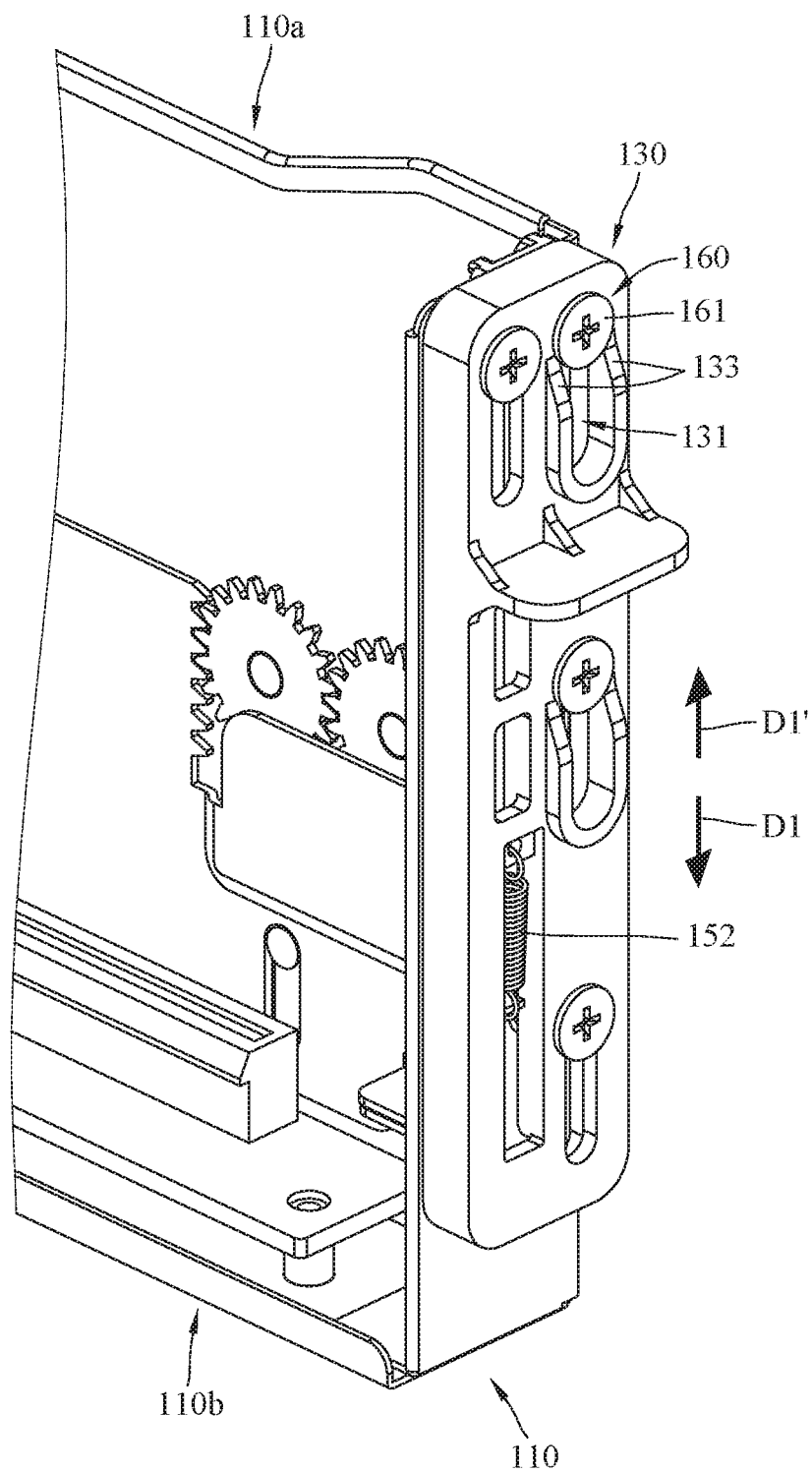
FIG. 5A is a side view of the cage in FIG. 2 when the operative component is in the original position.
Figure 5B:
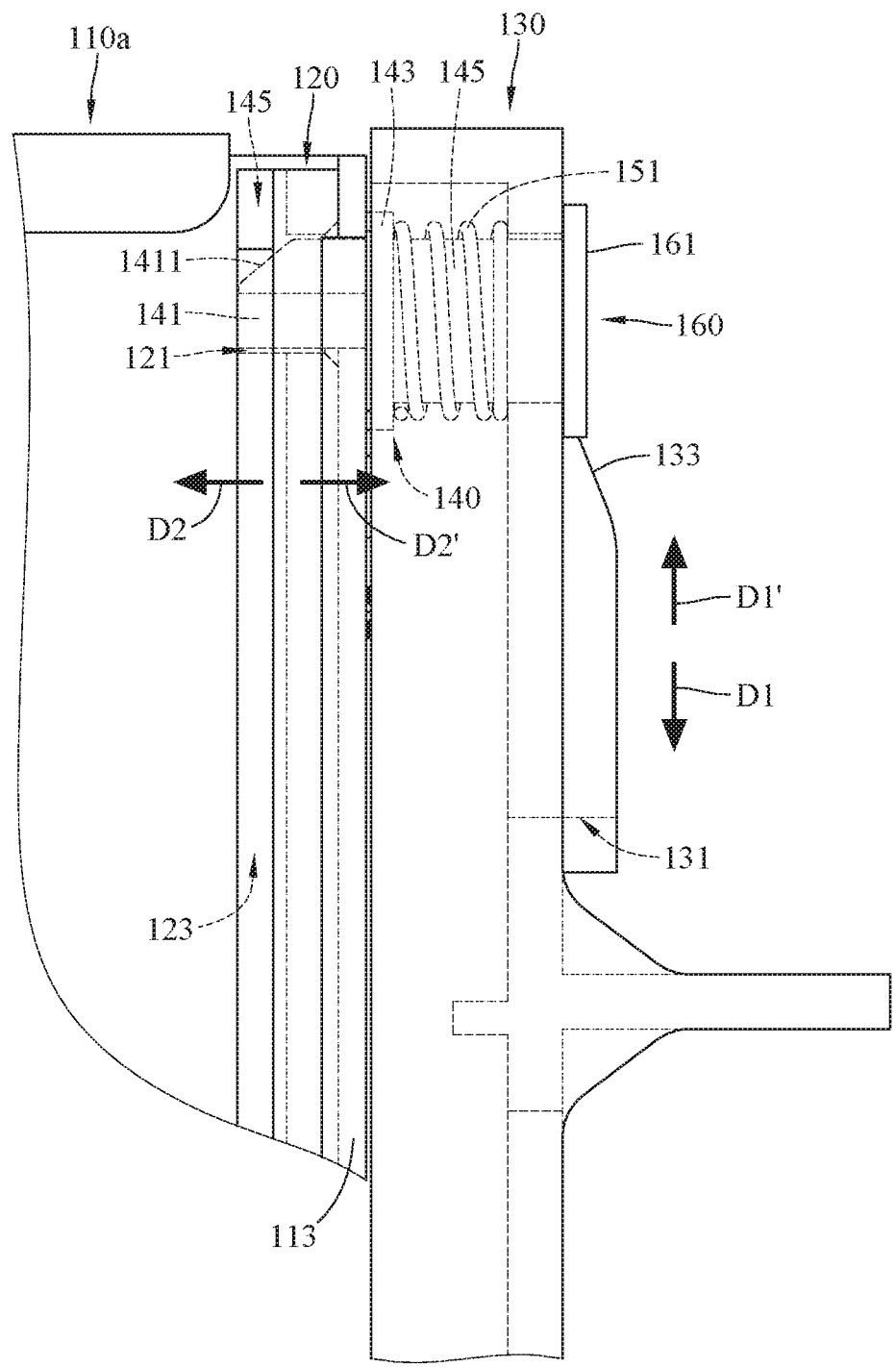
FIG. 5B-5C are partial enlarged views of different parts of the cage in FIG. 5A.
Figure 5C:
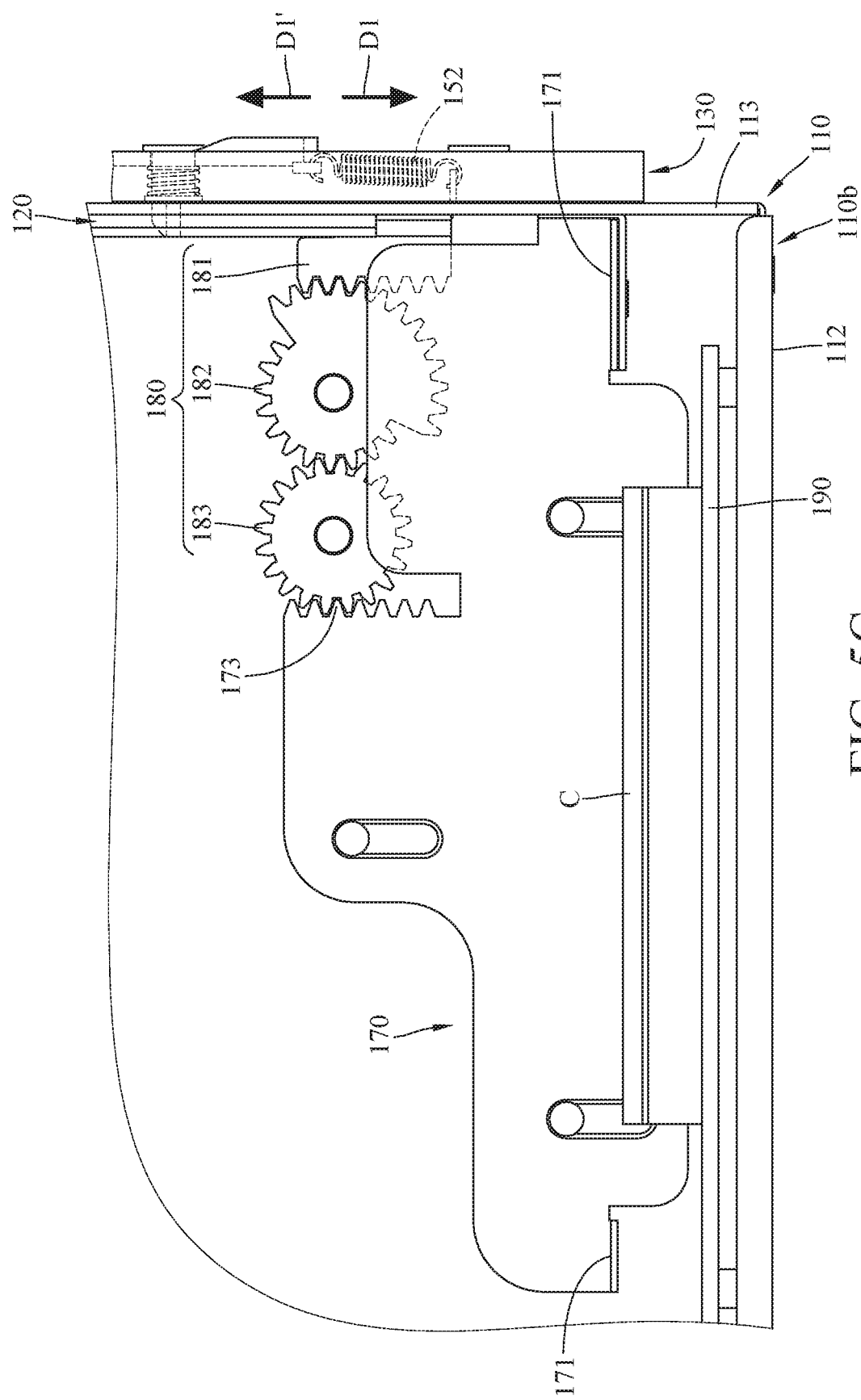

The cage 1 will be described in detail hereinafter with further reference to FIGS. 3-5C, where FIG. 3 is an exploded view of the cage 1 in FIG. 2, FIG. 4 is a partial enlarged perspective view of the cage 1 in FIG. 2, FIG. 5A is a side view of the cage 1 in FIG. 2 when the operative component 130 is in the original position, and FIGS. 5B-5C are partial enlarged views of different parts of the cage 1 in FIG. 5A.

In this embodiment, the cage 1 may include a cage body 110, a rail 120, an operative component 130, and at least one holder 140. The cage body 110 is configured to accommodate at least one expansion card 9; the rail 120 is fixed on one side of the cage body 110 and configured to guide the expansion card 9 to move along the insertion/removal direction (i.e., the direction D1 or D1') with respect to the cage body 110; the holders 140 are disposed on the rail 120 and movably in directions (e.g., directions D2 and D2') different from the insertion/removal direction of the expansion card 9 and therefore are able to hold the expansion card 9 in the require position; the operative component 130 is movably disposed on a side of the cage body 110 located adjacent to the rail 120 and is configured to move the holders 140. As shown, in this embodiment, the operative component 130 is slidable along the direction D1 or D1'.

The directions D2 and D2' are not parallel to the directions D1 and Dr; in other words, the moving directions of the holder 140 are at an angle to the insertion/removal direction of the expansion card 9. As shown, in some other embodiments, the moving directions of the holder 140 (i.e., the directions D2 and D2') are substantially perpendicular to the insertion/removal direction of the expansion card 9 (i.e., the directions D1 and Dr). This configuration ensures that the holders 140 can effectively stop the expansion card 9 from moving in the removal direction. Note that the angle of the moving directions of the holder 140 to the insertion/removal direction of the expansion card 9 can be modified according to actual requirements and is not intended to limit the disclosure.

In detail, in this embodiment, the cage body 110 is a box-like container that opens at two sides. As shown, the cage body 110 has an insertion side 110a and a docking side 110b. The insertion side 110a is a side of the cage body 110 that allows the insertion of the expansion card 9 into the cage body 110 and the removal of the expansion card 9 from the cage body 110, while the docking side 110b is located opposite to the insertion side 110a and has the connector C disposed thereon. As shown in FIG. 2, along the direction D1, the expansion card 9 can be placed into the cage body 110 through the insertion side 110a and then electrically connected to the connector C at the docking side 110b.

In more detail, the cage body 110 may include a first plate portion 111, a second plate portion 112, a third plate portion 113, and a fourth plate portion 114. The second plate portion 112, the third plate portion 113, and the fourth plate portion 114 are respectively connected to different sides of the first plate portion 111 so as to form a space for accommodating the expansion card 9 with the first plate portion 111. The third plate portion 113 and the fourth plate portion 114 are located opposite to each other. The second plate portion 112 is connected to and located between the third plate portion 113 and the fourth plate portion 114. The first plate portion 111, the third plate portion 113, and the fourth plate portion 114 together form an opening (not numbered) at the insertion side 110a of the cage body 110 for the insertion/removal of the expansion card 9. The aforementioned I/O board 190 and the connector C thereon are disposed on the second plate portion 112, thus, the docking side 110b is located at the second plate portion 112. The fourth plate portion 114 has a mating structure (not numbered) for the fixation of the bracket 930 of the expansion card 9 but not intending to limit the disclosure. In this embodiment, the rail 120, the operative component 130, and the holder 140 are all disposed on the third plate portion 113; that is, the rail 120, the operative component 130, and the holder 140 are arranged on the same side of the cage body 110.

Then, the rail 120, the operative component 130, and the holder 140 will be illustrated in detail hereinafter. In this embodiment, the third plate portion 113 has, for example, at least one through hole 1131; the rail 120 may have at least one through hole 121 respectively corresponding to the through holes 1131 of the third plate portion 113; each of the holders 140 may include a flange portion 143, a stopping post 141, and a mounting portion 145, where the stopping post 141 and the mounting portion 145 respectively protrude outwards in opposite directions from two opposite sides of the flange portion 143; the operative component 130 may have at least one guide slot 131 extending in the direction D1 and respectively corresponding to the mounting portions 145 of the holders 140. In addition, the cage 1 may further include at least one first elastic component 151, a second elastic component 152, and at least one fastener 160.

Figure 8A:
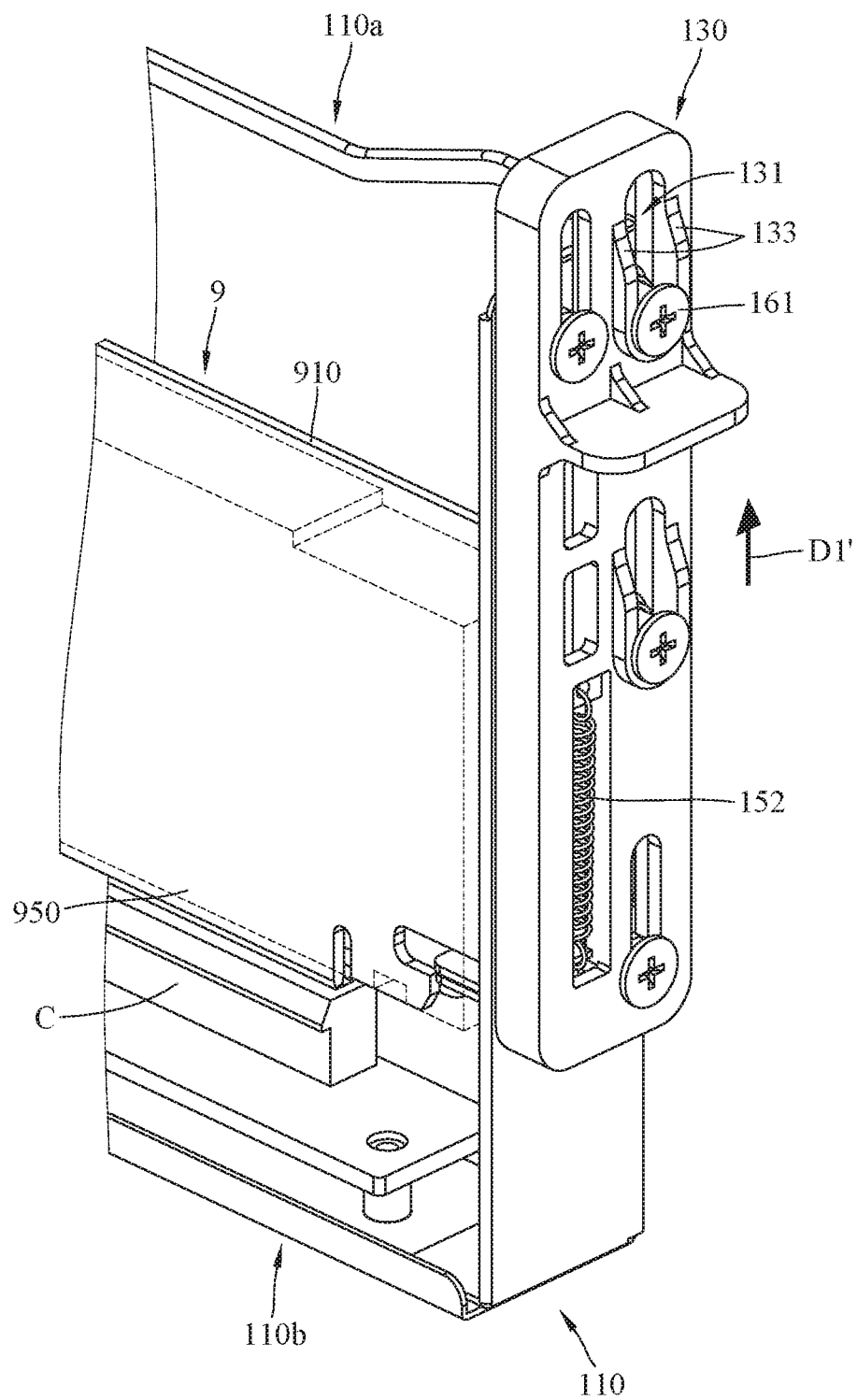
FIG. 8A illustrates a partial enlarged view of the cage in FIG. 7B when the operative component is in the releasing position.
Figure 8B:
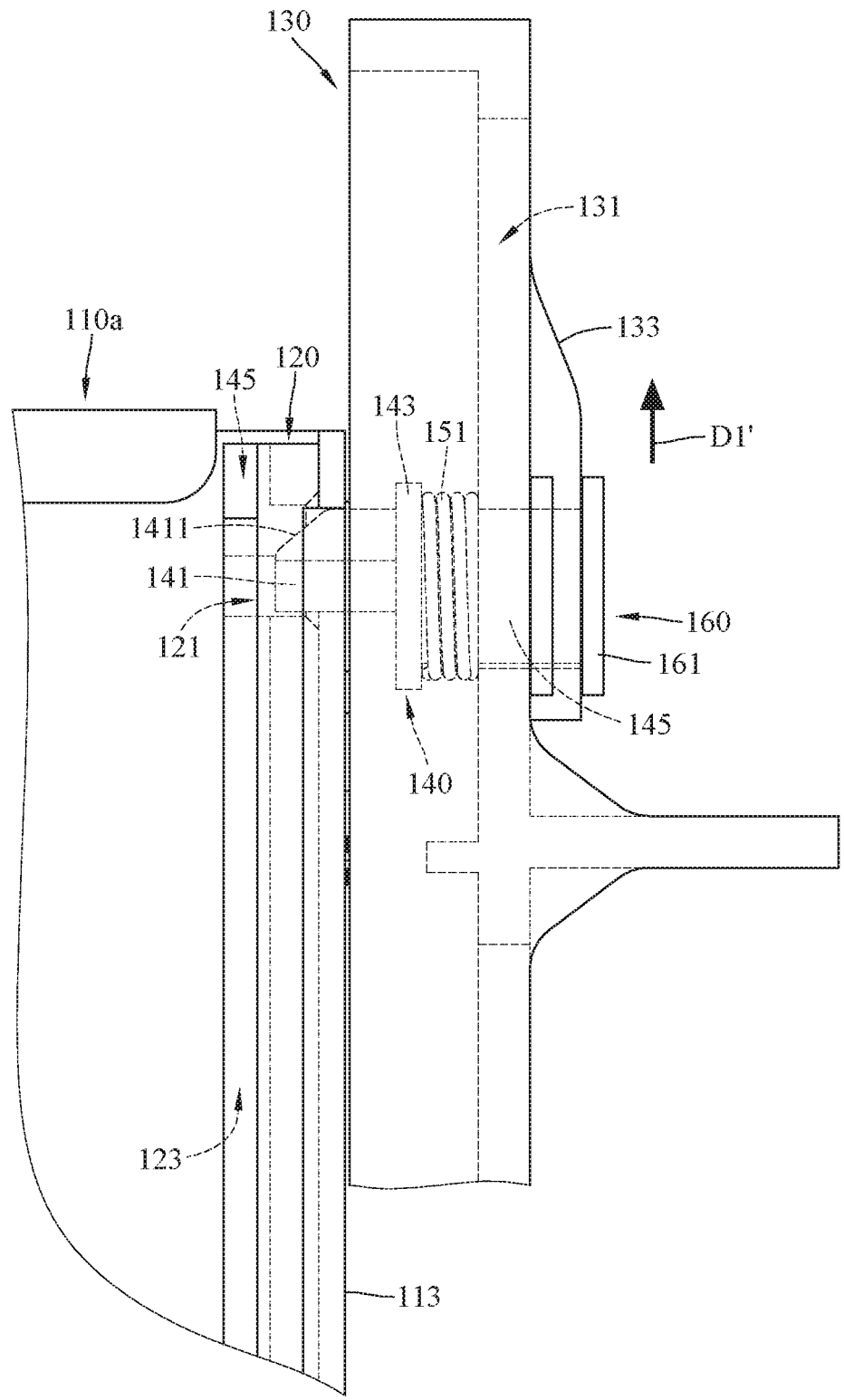
FIGS. 8B-8C are partial enlarged views of different parts of the cage in FIG. 8A.
Figure 8C:
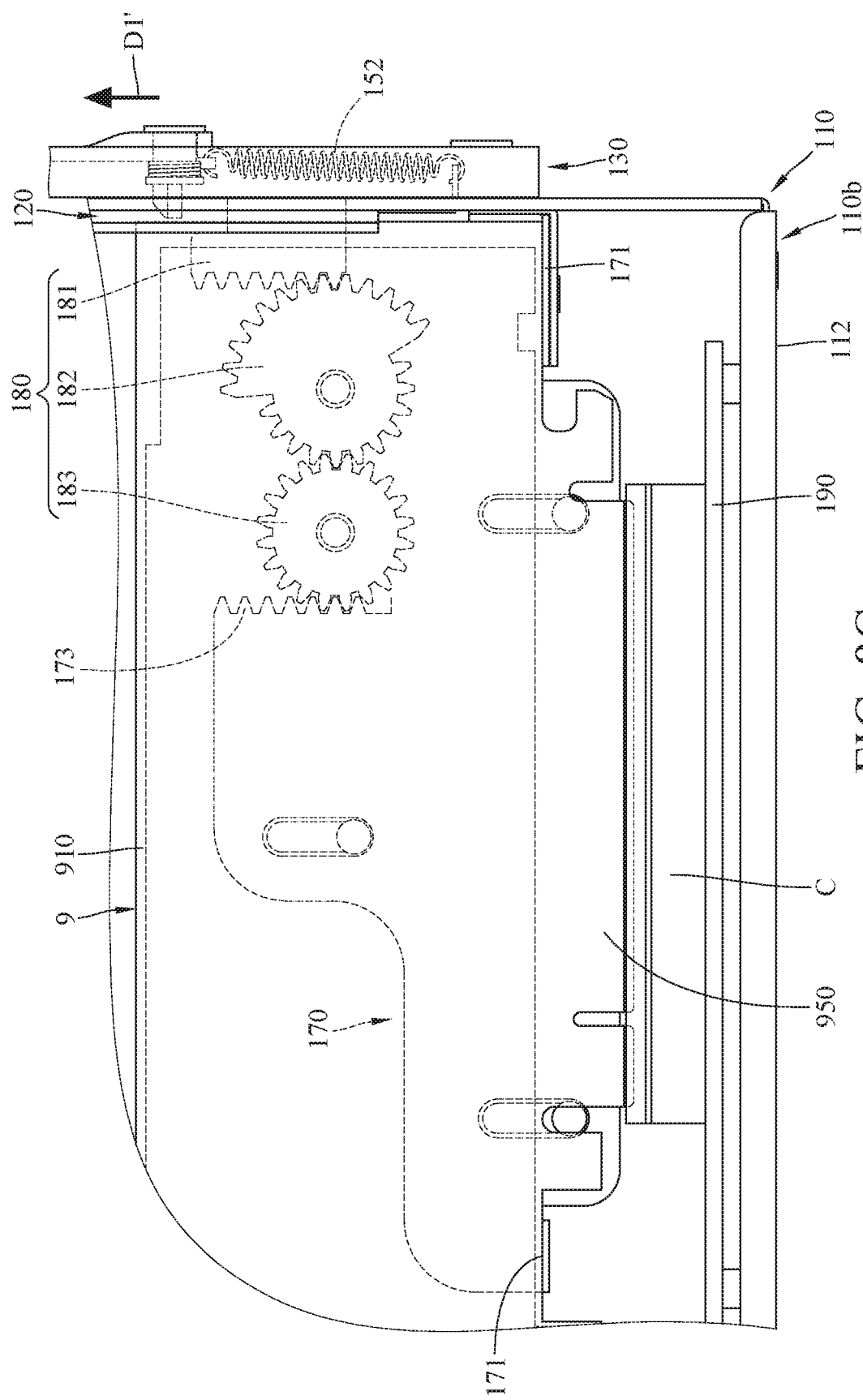

The rail 120 is disposed at, for example, the inner side of the third plate portion 113. The stopping post 141 of the holder 140 is movably disposed through the through hole 1131 of the third plate portion 113 and the through hole 121 of the rail 120. The flange portion 143 of the holder 140 presses against the other side of the third plate portion 113 opposite to the rail 120 (i.e., the outer side of the third plate portion 113). The operative component 130 is slidably disposed at, for example, the outer side of the third plate portion 113 so as to cover the holders 140. The operative component 130 is switchable between an original position (as shown in FIGS. 5A-5C) and a releasing position (as shown in FIGS. 8A-8C described in later paragraphs). Each of the fasteners 160 is, for example, a screw. Each of the fasteners 160 at least has a head portion 161 and a threaded portion (not numbered) connected to each other. The fasteners 160 are disposed through the operative component 130 and the guide slots 131 and are respectively screwed to the mounting portions 145 of the holders 140. The flange portion 143 of the holder 140 and the head portion 161 of the fastener 160 both have an outer diameter larger than the width of the guide slot 131 of the operative component 130. Thus, the operative component 130 is allowed to slide along the direction D1 or D1' with respect to the holder 140 and the fastener 160, and the holder 140 and the fastener 160 are allowed to move along the direction D2 or D2' with respect to the guide slot 131. Herein, the "width" is measured along the direction substantially perpendicular to the insertion/removal direction of the expansion card 9 and the moving direction of the holder 140.

Each of the first elastic components 151 is, for example, a compression spring being clamped by the flange portion 143 of the holder 140 and the operative component 130. The first elastic component 151 has an outer diameter at least larger than the width of the guide slot 131 of the operative component 130. Thus, the first elastic component 151 can constantly apply force the flange portion 143 of the holder 140 to move away from the operative component 130 so as to force the stopping post 141 of the holder 140 to insert into the through hole 121 of the rail 120. The second elastic component 152 is, for example, an extension spring being connected to the operative component 130 and the third plate portion 113 and therefore can force the operative component 130 to move toward the original position along the direction D1.

In addition, in this embodiment, the operative component 130 may further have at least one inclined guiding surface 133. The inclined guiding surface 133 is located at the outer side of the operative component 130. The inclined guiding surface 133 gradually protrudes away from the rail 120 along the direction D1 and therefore becomes a ramp relative to the flat surface of the operative component 130. The head portion 161 of the fastener 160 can press against the inclined guiding surface 133. In such an arrangement, during the movement of the operative component 130 relative to the cage body 110, the position of the head portion 161 of the fastener 160 relative to the rail 120 can be moved by the inclined guiding surface 133 so that the distance between the fastener 160 and the rail 120 is changed, and the insertion depth of the stopping post 141 of the holder 140 into the through hole 121 of the rail 120 is changed with the movement of fastener 160.

In this embodiment, the rail 120 may further have a groove 123 and a tapered opening 125. The tapered opening 125 is located at the end of the rail 120 located adjacent to the insertion side 110a of the cage body 110 and is tapered toward the docking side 110b. The groove 123 extends toward the docking side 110b from the tapered opening 125 along a direction substantially parallel to the direction D1 and D1'. That is, the groove 123 is substantially extending along the insertion/removal direction of the expansion card 9. There are two through holes 121 located at and connected to the groove 123. The through holes 121 on the groove 123 are spaced apart by each other in the insertion/removal direction, the holders 140 are respectively removably disposed through the through holes 121 so that the holders 140 are located at different parts of the groove 123. As shown, in the groove 123, the holders 140 can be served as stoppers respectively located at different distances to the insertion side 110a.

In this embodiment, the minimum width of the tapered opening 125 and the width of the groove 123 are both at least larger than the thickness of the circuit board 910 of the expansion card 9. This ensures that the circuit board 910 of the expansion card 9 can be inserted into the groove 123 of the rail 120 and slide along the insertion/removal direction. The expansion card 9 can be guided and positioned by the groove 123 of the rail 120. Specifically, the groove 123 of the rail 120 only allows the expansion card 9 to move along the insertion/removal direction. Note that the groove 123 of the rail 120 only covers a small part of the trace free area 911 of the circuit board 910, in other words, the depth of the groove 123 of the rail 120 is at least not larger than the width of the trace free area 911 of the circuit board 910. Thus, the rail 120 is prevented from hitting the electrical component or trace on the circuit board 910 while the expansion card 9 is sliding along the rail 120. In addition, the width of the through hole 121 is at least larger than the width of the groove 123 so that the stopping post 141 of the holder 140 can be kept in the through hole 121 and prevented from moving along the insertion/removal direction.

In more detail, in this embodiment, the stopping posts 141 of the holders 140 may each have an inclined contact surface 1411. The inclined contact surface 1411 is located at a side of the stopping post 141 facing the insertion side 110a and is exposed from the groove 123. The inclined contact surface 1411 is at an angle to the moving direction of the holder 140 (i.e., the direction D2 or D2') and the insertion/removal direction of the expansion card 9 (i.e., the direction D1 or D1'). The inclined contact surfaces 1411 are configured to encounter the expansion card 9 moving in the insertion direction. When the circuit board 910 of the expansion card 9 hits the inclined contact surfaces 1411, the inclined contact surfaces 1411 is able to transfer the force from the circuit board 910 from the direction D1 to the direction D2' to push the holder 140 inwards.

Further, for the facilitation of the removal of the expansion card 9, in this embodiment, the cage 1 may further include a pushing component 170 and a transmission assembly 180. The pushing component 170 is slidably disposed on the first plate portion 11 of the cage body 110 along the direction D1 or D1', and the transmission assembly 180 is connected to the operative component 130 and the pushing component 170 and is configured to move the pushing component 170 when being moved by the operative component 130. And the movement of the pushing component 170 can cause the expansion card 9 to move away from the connector C.

More specifically, as shown, the third plate portion 113 may further have a groove 1133. The groove 1133 extends along the direction D1 or D1' and located adjacent to the edge of third plate portion 113 connected to the first plate portion 111. The pushing component 170 may include at least one pushing portion 171 configured for pushing the expansion card 9 and a gear rack portion 173 configured for engaging with the transmission assembly 180. The transmission assembly 180 may include a gear rack piece 181, a first gear 182, and a second gear 183.

The gear rack piece 181 is fixed to the operative component 130 and slidably disposed through the groove 1133 of the third plate portion 113 so that the gear rack piece 181 can be moved along the direction D1 or D1' by the movement of the operative component 130. The first gear 182 and the second gear 183 are pivotably disposed on the first plate portion 111 of the cage body 110. The first gear 182 is engaged with the gear rack piece 181 and the second gear 183. The second gear 183 is engaged with the first gear 182 and the gear rack portion 173 of the pushing component 170. This arrangement allows the movement of the operative component 130 along the direction D1 or D1' to move the pushing portion 171 of the pushing component 170 along the same direction via the gear rack piece 181, the first gear 182, the second gear 183, and the gear rack portion 173 of the pushing component 170.

In more detail, in this embodiment, the parts of the first gear 182 respectively for engaging with the gear rack piece 181 and the second gear 183 have different radius. As shown, the part of the first gear 182 being engaged to the gear rack piece 181 has a radius larger than that of the other part being engaged to the second gear 183. In such an arrangement, the force transmitted from the gear rack piece 181 to the second gear 183 is increased by the first gear 182; in other words, the first gear 182 can decrease the effort that the operative component 130 is required to move the pushing portion 171.

Figure 6A:
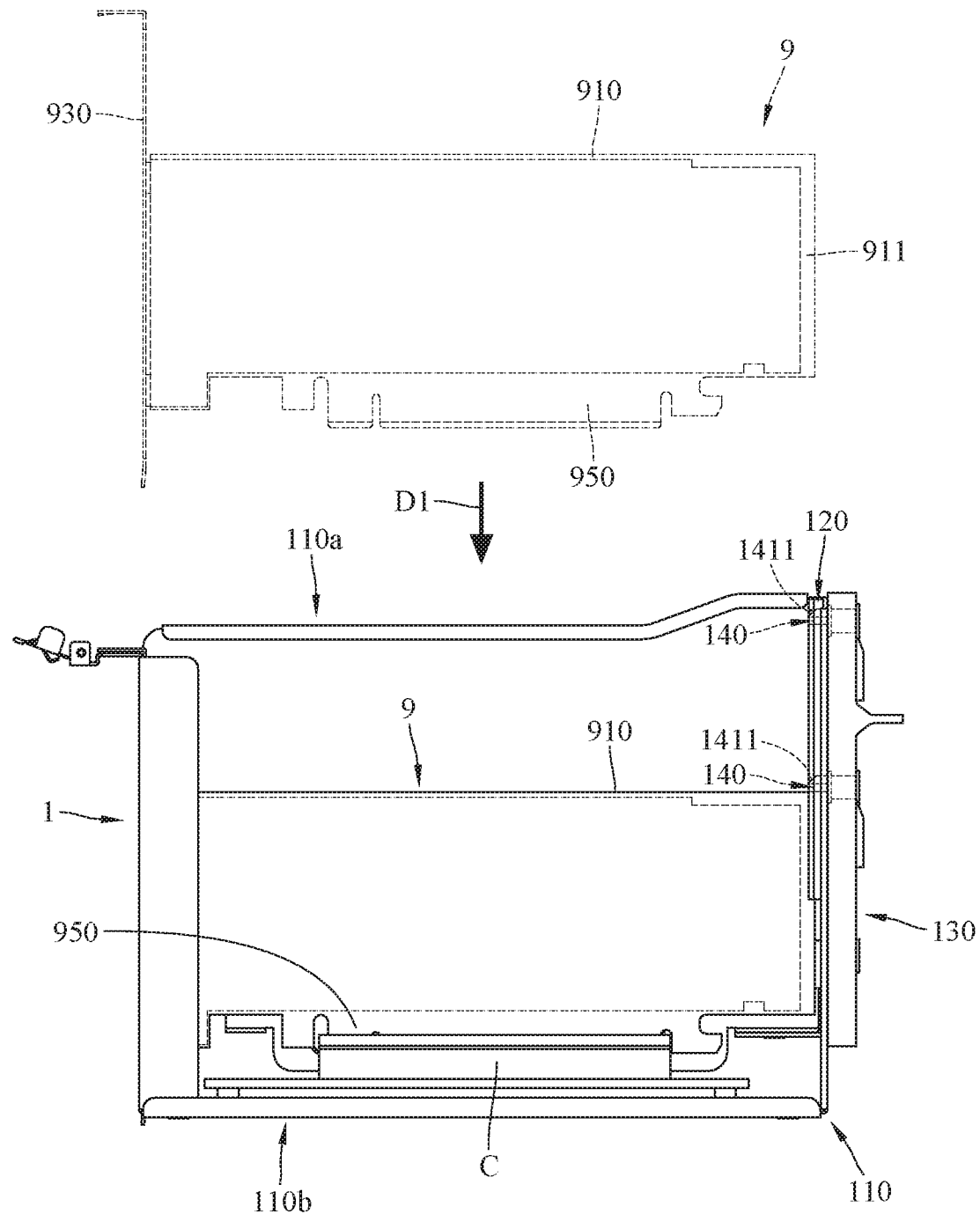
FIG. 6A illustrates the installation of the expansion card in FIG. 2.

Please further refer to FIG. 6A, the expansion card 9 can be inserted into the cage 1 via the insertion side 110a of the cage body 110 along the direction D1, during the insertion of the expansion card 9, the trace free area 911 of the circuit board 910 of the expansion card 9 is inserted into the groove 123 of the rail 120, the circuit board 910 can push the inclined contact surfaces 1411 of the holder 140 at the through hole 121 of the rail 120 so as to force the stopping posts 141 to move inwards along the direction D2', so that the circuit board 910 can cause the stopping posts 141 to move away from the groove 123. As a result, the expansion card 9 is allowed to be moved toward the docking side 110b of the cage body 110 and then the edge connector 950 can be plugged into the connector C. When the expansion card 9 is installed in position, at least one of the holders 140 will be free from the circuit board 910 of the expansion card 9 and moved back to the groove 120 along the direction D2 by the first elastic component 151. The returned holder 140 is kept in the groove 123 and therefore can stop the expansion card 9 from moving along the direction D1', thereby preventing the edge connector 950 from disengaging from the connector C.

Figure 6B:
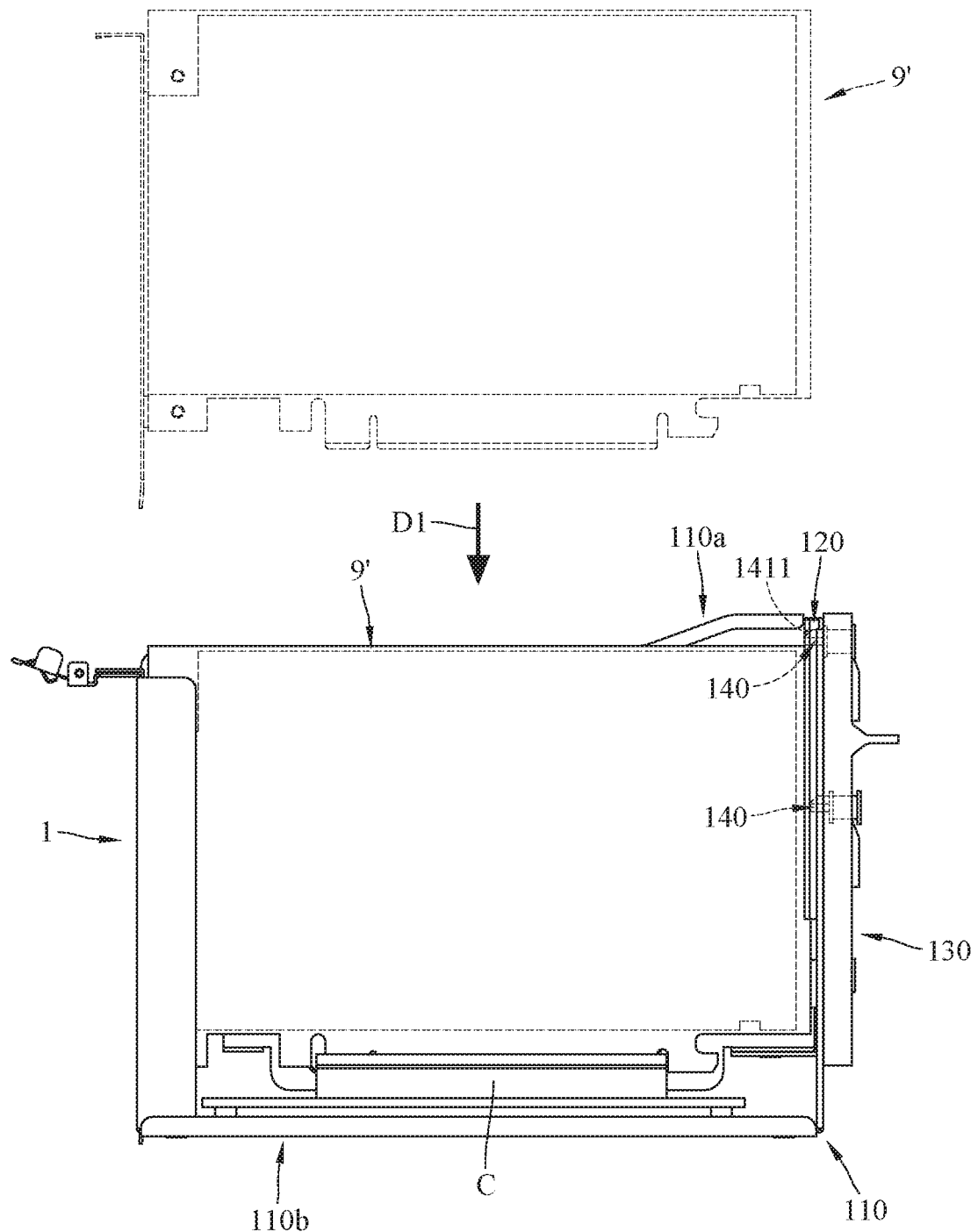
FIG. 6B illustrates the installation of another expansion card.

The height of the expansion card shown in the previous drawings is exemplary and not intended to limit the disclosure. Referring to FIG. 6B, the cage 1 also can accommodate another expansion card 9' having a height larger than that of the expansion card 9. Specifically, the main difference between the expansion card 9' and the expansion card 9 is their height of the circuit board that is measured along the insertion/removal direction. The expansion card 9' can be installed by the same way of installing the expansion card 9. For example, as the expansion card 9' is plugged into the connector C, the holder 140 that is located closer to the insertion side 110a of the cage body 110 is not pressed inwards and can return to its original position to stop the expansion card 9' from moving away from the connector C.

In summary, the cage 1 is available for accommodating at least two different sizes of expansion card, and the cage 1 has at least one holder 140 that can automatically return to the position to block the expansion card so that the installation of the expansion card can be done by merely inserting it into the cage body 110. As such, the cage 1 achieves a simple and convenient installation step for various types of expansion cards. Also, the groove 123 of the rail 120 and the holder 140 can restrict the movement of the expansion card in multiple directions so that the expansion card is prevented from moving due to vibration or sudden impact and thereby securing the position and electrical connection of the expansion card. In the above configuration, the holders 140 and the operative component 130 for moving the holders 140 are small in volume and their motion takes a small space, which helps the miniaturization of the cage 1 and thus helping the cage 1 to be applied to the compact internal arrangement of the server.

It is understood that the quantity of the holders between the insertion side and the docking side of the cage body can be decreased or increased as will. In one embodiment, there may be only one holder arranged at the rail; in some other embodiments, there may be more than three holders arranged at the rail and located at different distances to the insertion side so as to make the cage available for more add-one cards of different heights, but the disclosure is not limited to.

Figure 7A:
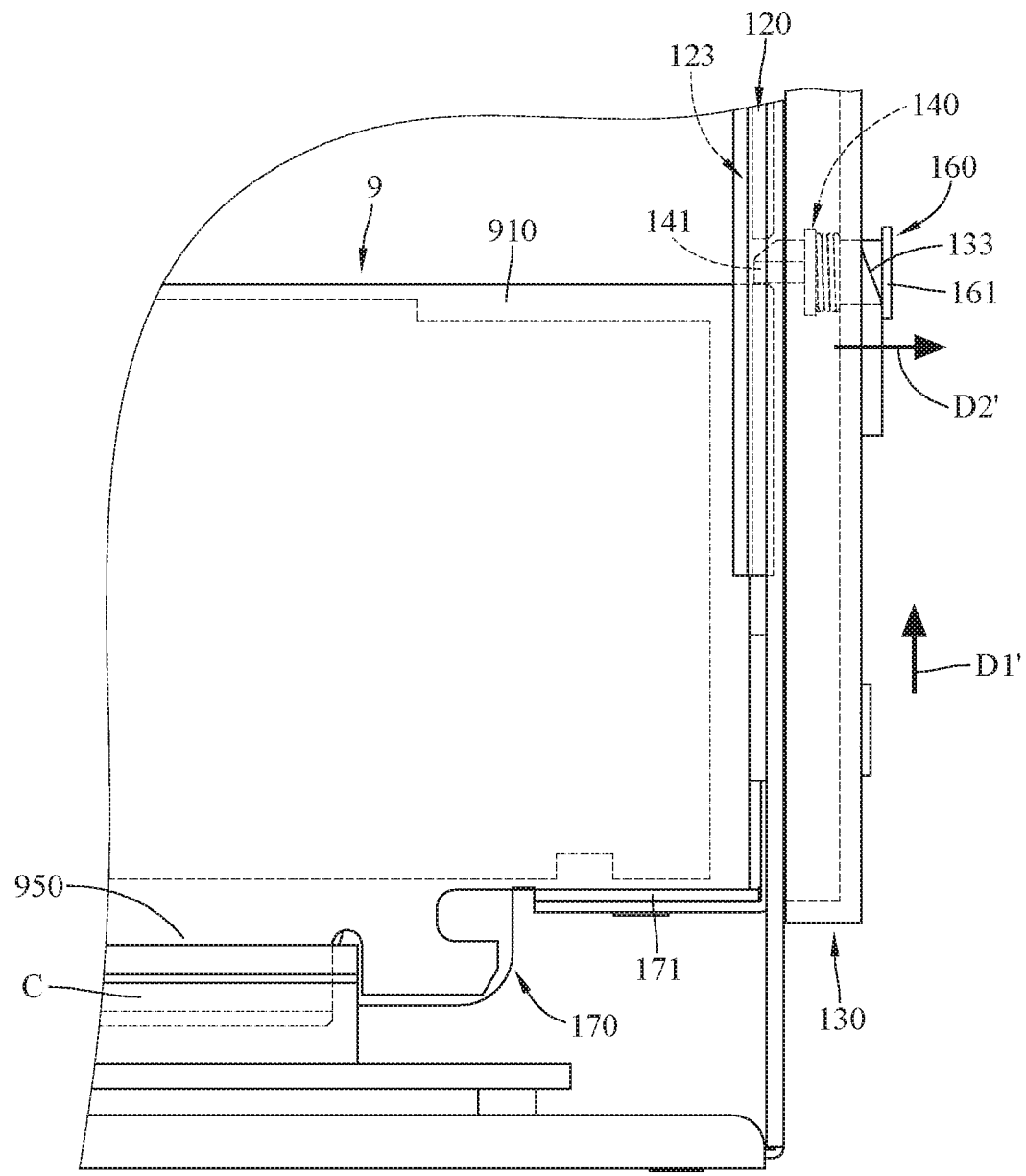
FIGS. 7A-7B are partial enlarged views of the cage showing the removal of the expansion card.
Figure 7B:
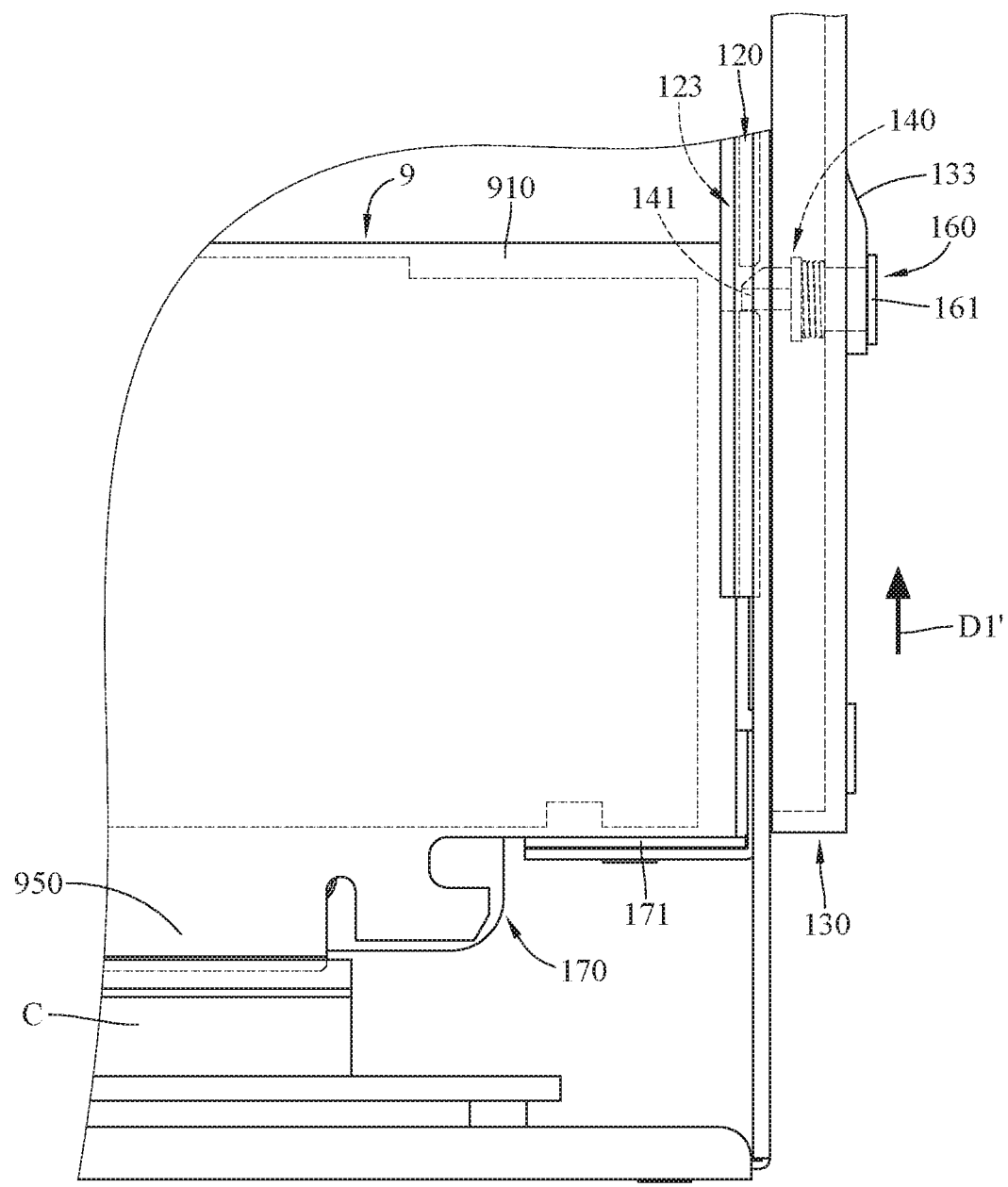

Then, referring to FIGS. 7A-8C to describe the removal of the expansion card from the cage 1, where FIGS. 7A-7B are partial enlarged views of the cage 1 showing the removal of the expansion card 9, FIG. 8A illustrates a partial enlarged view of the cage 1 in FIG. 7B when the operative component 130 is in the releasing position, and FIGS. 8B-8C are partial enlarged views of different parts of the cage 1 in FIG. 8A.

Specifically, to release the expansion card 9 from the holder 140, the first step is to move the operative component 130 in the direction D1' from the original position, during this movement, the fastener 160 moves along the guide slot 131 of the operative component 130, and the contour of the inclined guiding surface 133 of the operative component 130 simultaneously force the head portion 161 of the fastener 160 to move away from the rail 120, such that the fastener 160 pulls the stopping post 141 of the holder 140 out of the groove 123 of the rail 120 along the direction D2'. As a result, the holder 140 is removed from the circuit board 910 of the expansion card 9, that is, the restriction to the expansion card 9 in the direction D1' is canceled.

Then, as the operative component 130 continue moves toward the releasing position along the direction D1', the operative component 130 also moves the pushing component 170 and the pushing portion 171 along the direction D1' via the gear rack piece 181, the first gear 182, the second gear 183, and the gear rack portion 173 of the pushing component 170, such that the pushing portion 171 is forced to push the circuit board 910 of the expansion card 9 to move away from the docking side 110b of the cage body 110 in the direction D1'. By doing so, the expansion card 9 is disconnected from the connector C. And during the process, as discussed above, the first gear 182 can decrease the effort that the operative component 130 is required to move the pushing portion 171. As a result, the disconnection of the expansion card 9 from the connector C can be done by moving the operative component 130 along the removal direction of the expansion card 9. The removal step is simple and convenient.

After removing the expansion card 9, the second elastic component 152 can return the operative component 130 to its original position so as to let the first elastic components 151 to return the holders 140 to their original positions.

The above is an exemplary embodiment of the disclosure, and the disclosure is not limited thereto. Some other exemplary embodiments of the disclosure are provided below, but for the purpose of simple illustration, only the differences between the previous and following embodiments will be described in detail, the same or similar part of them will be understood with reference to the previous paragraphs so will not be repeated. In addition, for the ease of understanding, the expansion card may be illustrated in some of the drawings of the following embodiments.

Figure 9:
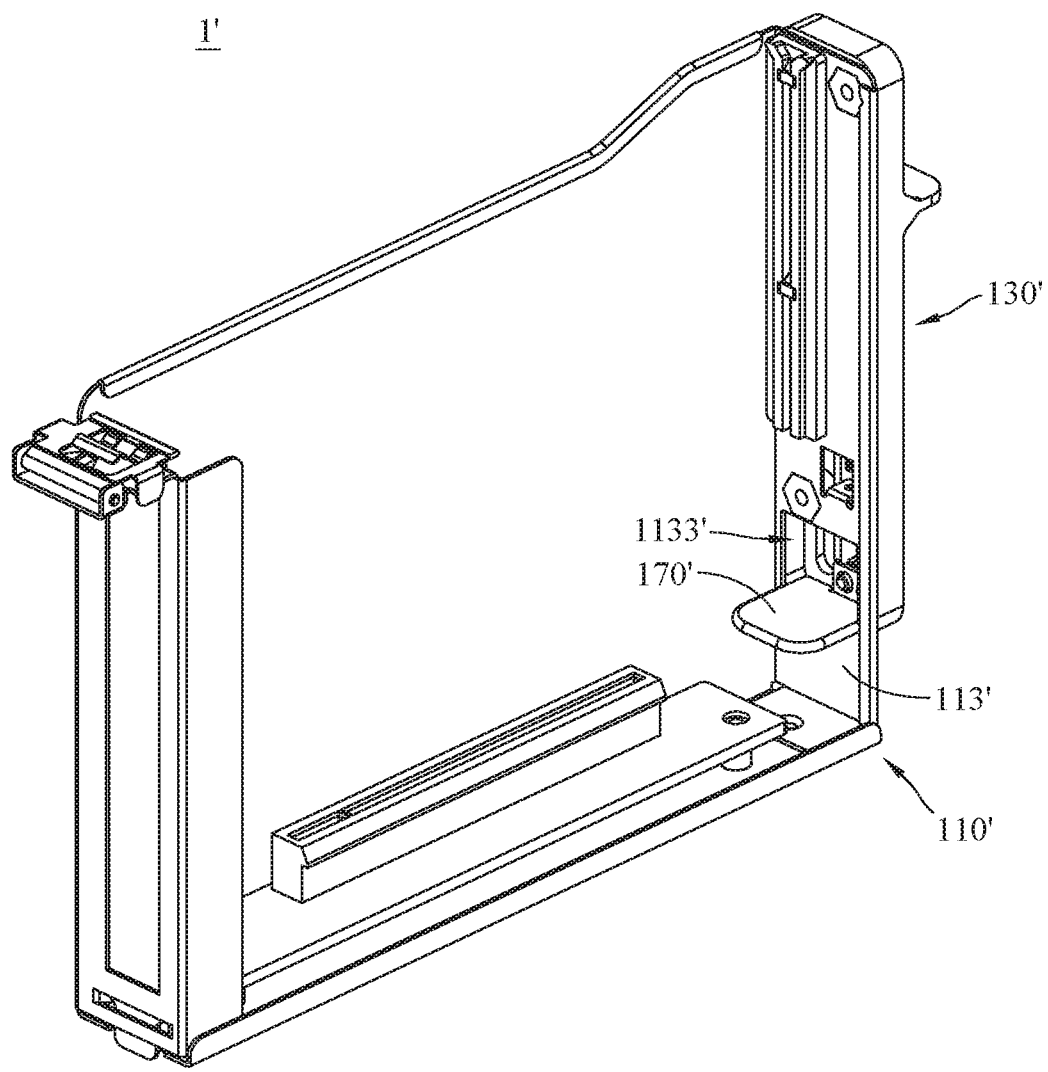
FIG. 9 is a perspective view of a cage for expansion card according to another embodiment of the disclosure.
Figure 10:
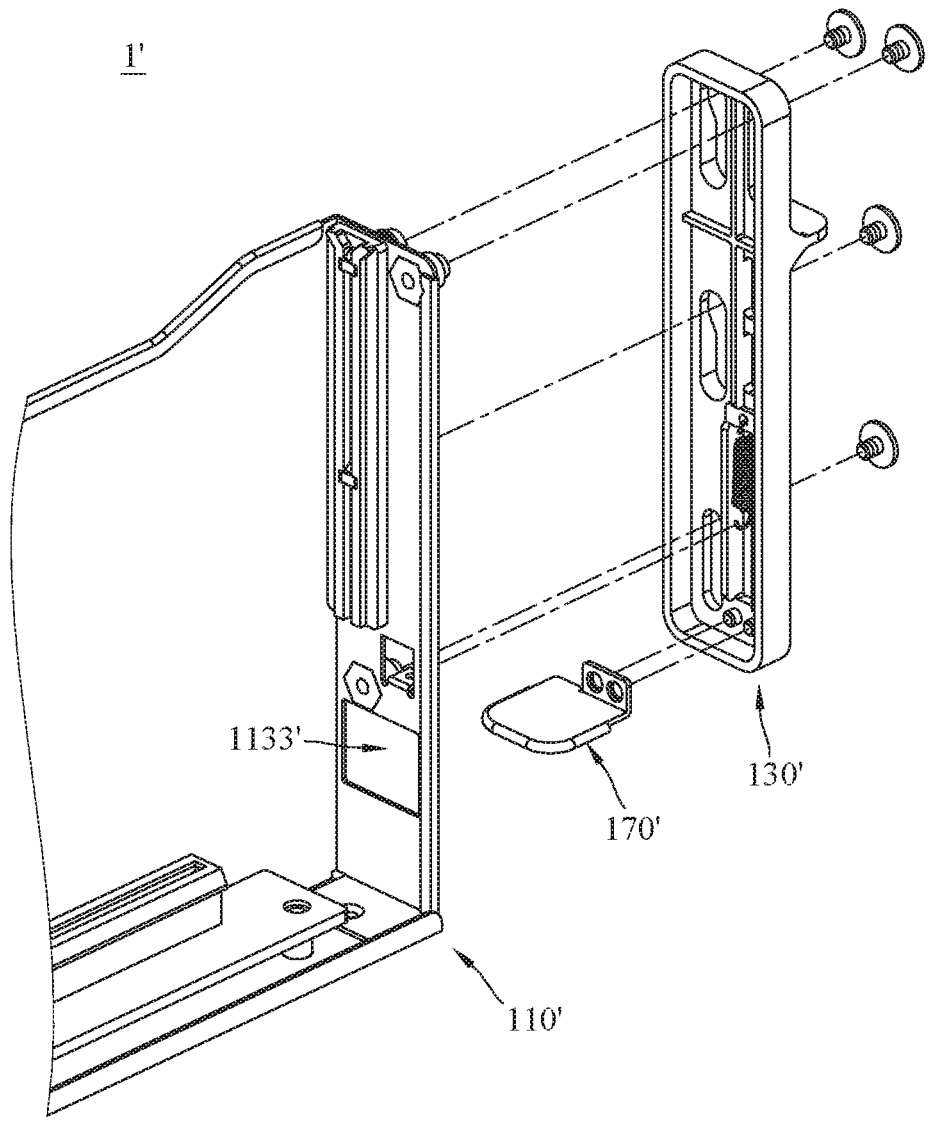
FIG. 10 is a partial enlarged exploded perspective view of the cage in FIG. 9.

For example, referring to FIGS. 9-10, FIG. 9 is a perspective view of a cage 1' according to another embodiment of the disclosure, and FIG. 10 is a partial enlarged exploded perspective view of the cage 1' in FIG. 9.

In this embodiment, the cage 1' omits the transmission assembly of the previous embodiment and includes a pushing component 170' directly fixed to an operative component 130' and slidably disposed through a groove 1133' of a third plate portion 113' of a cage body 110'. Thus, the movement of the operative component 130' toward the releasing position still can cause the pushing component 170' to achieve the aforementioned disconnection of expansion card.

Figure 11:
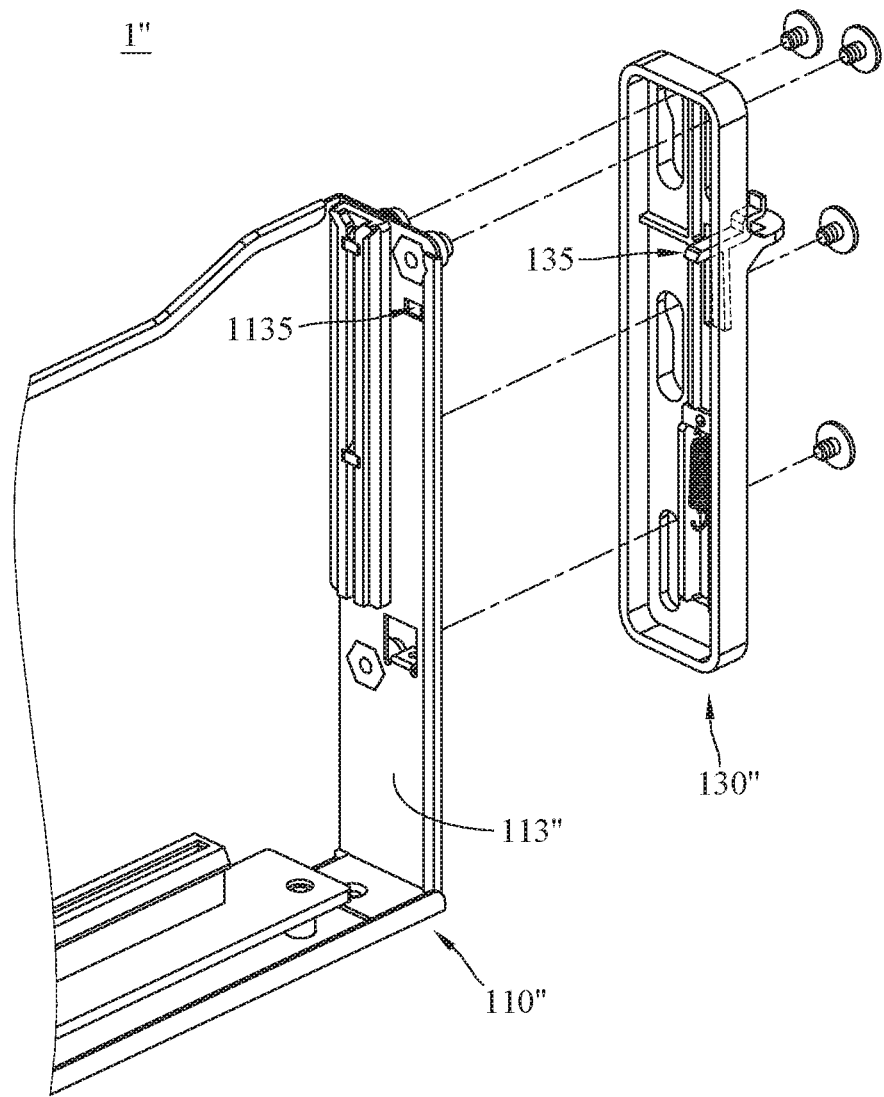
FIG. 11 is a partial enlarged exploded perspective view of a cage for expansion card according to still another embodiment of the disclosure.
Figure 12A:
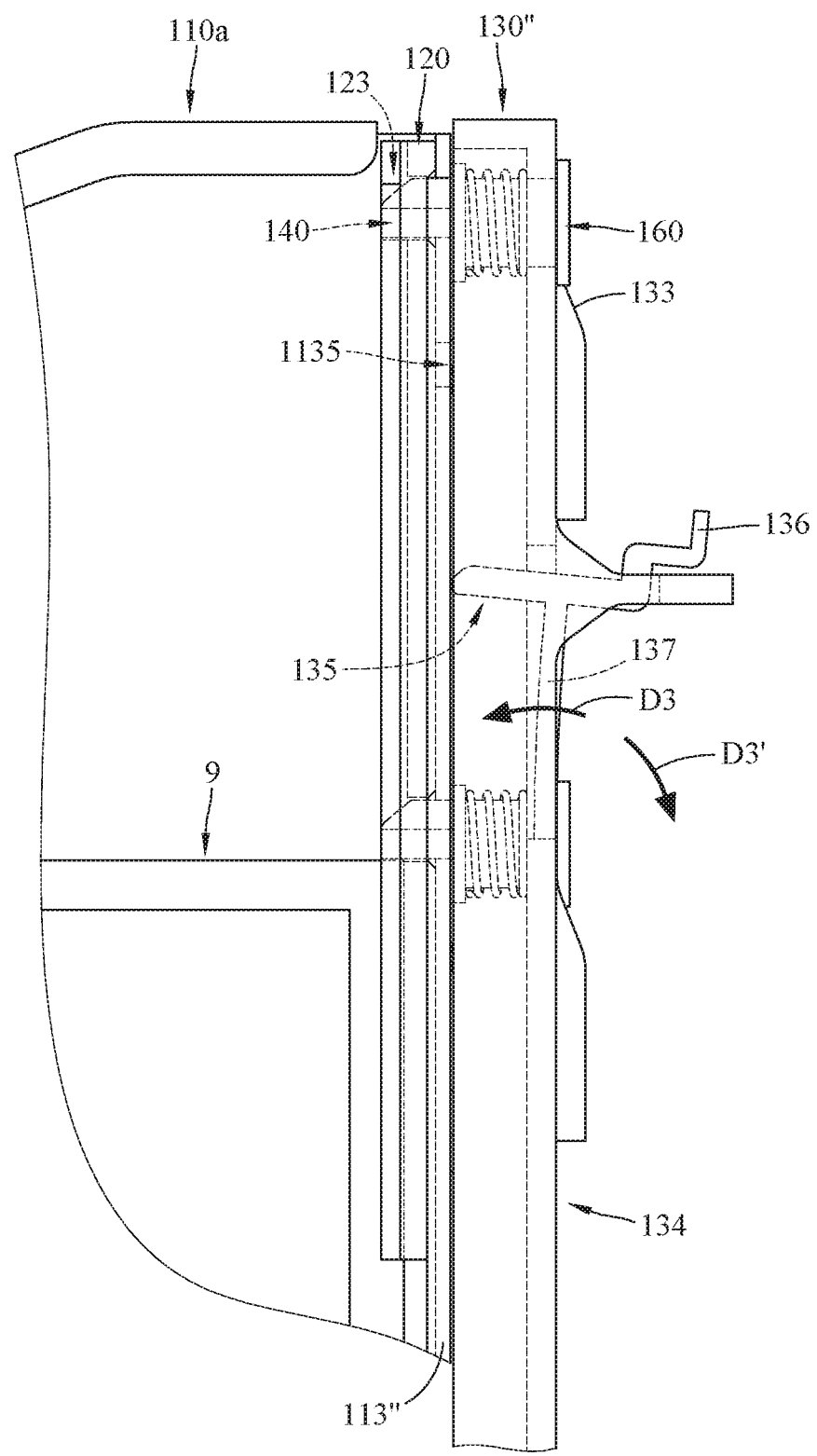
FIGS. 12A-12B illustrates partial enlarged top views of the cage in FIG. 11 when the operative component is in different positions.
Figure 12B:
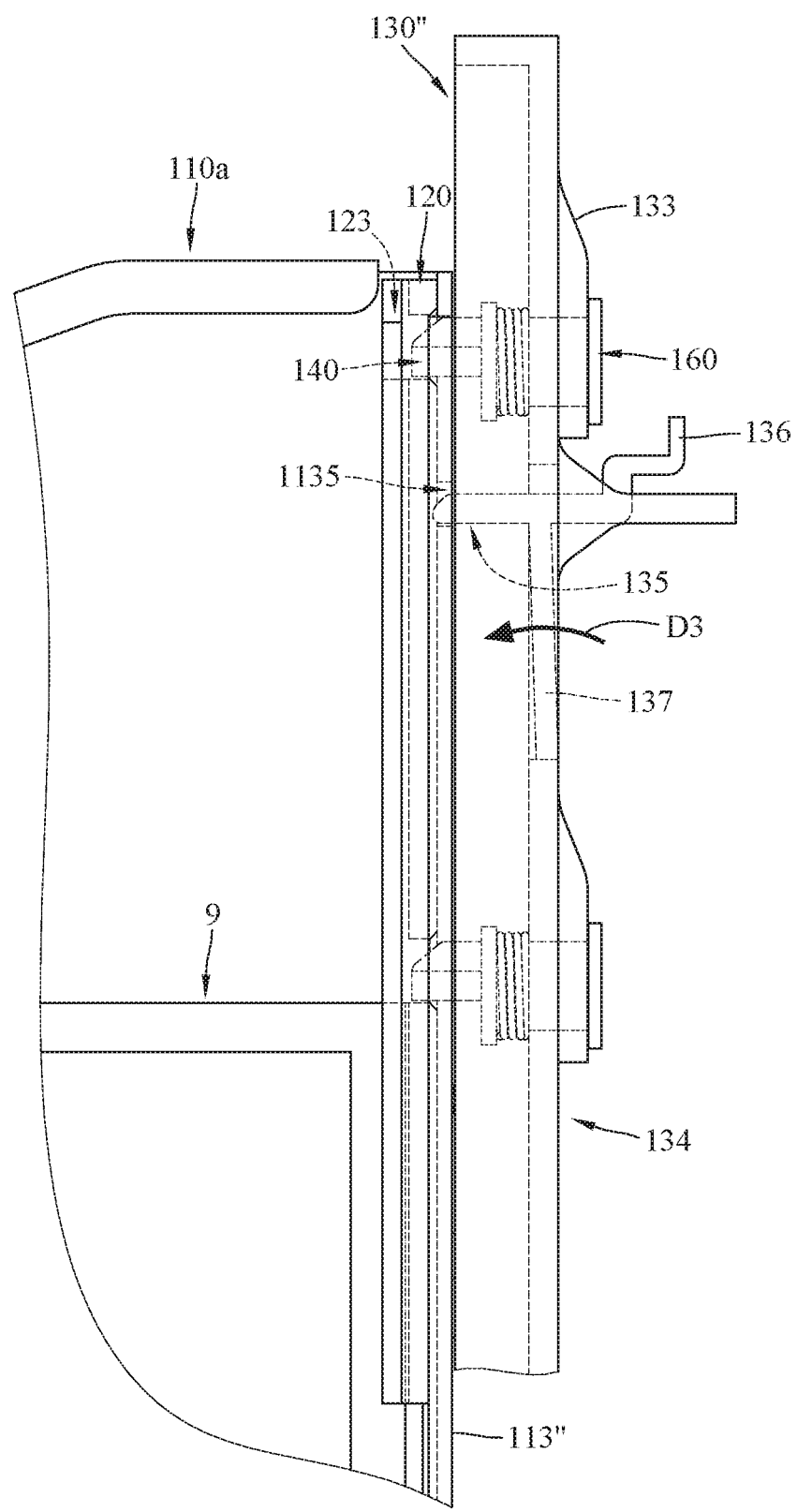

Alternatively, referring to FIGS. 11-12B, where FIG. 11 is a partial enlarged exploded perspective view of a cage 1" according to still another embodiment of the disclosure, and FIGS. 12A-12B illustrates partial enlarged top views of the cage 1" when an operative component 130" is in different positions.

In this embodiment, the operative component 130" of the cage 1" can fix itself at the releasing position. Specifically, a third plate portion 113" of a cage body 110" has an engagement hole 1135, the operative component 130" includes a main portion 134, an engaging portion 135, a handle portion 136, and an elastic portion 137, the engaging portion 135 and the handle portion 136 are connected to one end of the elastic portion 137 and are movably connected to the main portion 134 (e.g., along the direction D3 or D3') via the elastic portion 137. The engaging portion 135 and the handle portion 136 extend outwardly in different directions from the elastic portion 137, as shown, the engaging portion 135 extends toward the rail 120 from the elastic portion 137, and the handle portion 136 extends in a direction away from the rail 120 from the elastic portion 137.

In FIG. 12A, when the operative component 130" is in the original position, the holder 140, as discussed above, can block the groove 123 to restrict the movement of the expansion card 9. At this moment, the engaging portion 135 of the operative component 130" presses against the outer surface of the third plate portion 113", and the elastic portion 137 is slightly curved to store elastic potential energy.

In FIG. 12B, when the operative component 130" is switched to the releasing position, the holders 140, as discussed above, are removed from the groove 123 to release the expansion card 9, and, at this moment, the engaging portion 135 is moved to a position can correspond to the engagement hole 1135 of the third plate portion 113" by the operative component 130" so that the elastic portion 137 releases its elastic potential energy to cause the engaging portion 135 to engage into the engagement hole 1135 along the direction D3. As a result, the operative component 130" keeps itself in the releasing position when the engaging portion 135 is engaged with the engagement hole 1135. This allows the user to take out the expansion card 9 without holding the operative component 130".

The engaging portion 135 can be disengaged from the engagement hole 1135 by pressing the handle portion 136 of the operative component 130" (e.g., along the direction D3'), and then the second elastic component 152 can automatically return the operative component 130".

Figure 13:
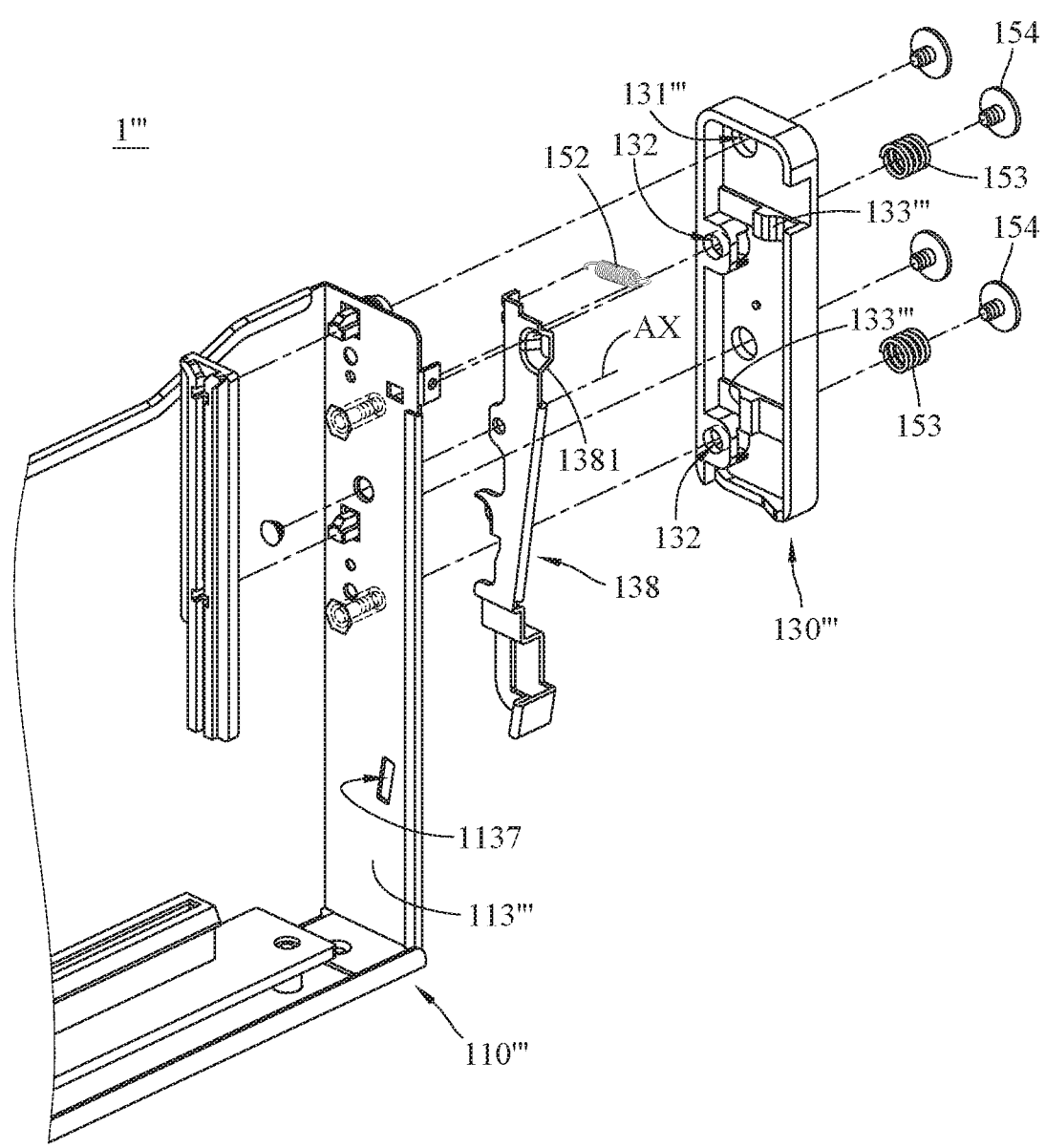
FIG. 13 is a partial enlarged exploded perspective view of a cage for expansion card according to yet still another embodiment of the disclosure.
Figure 14A:
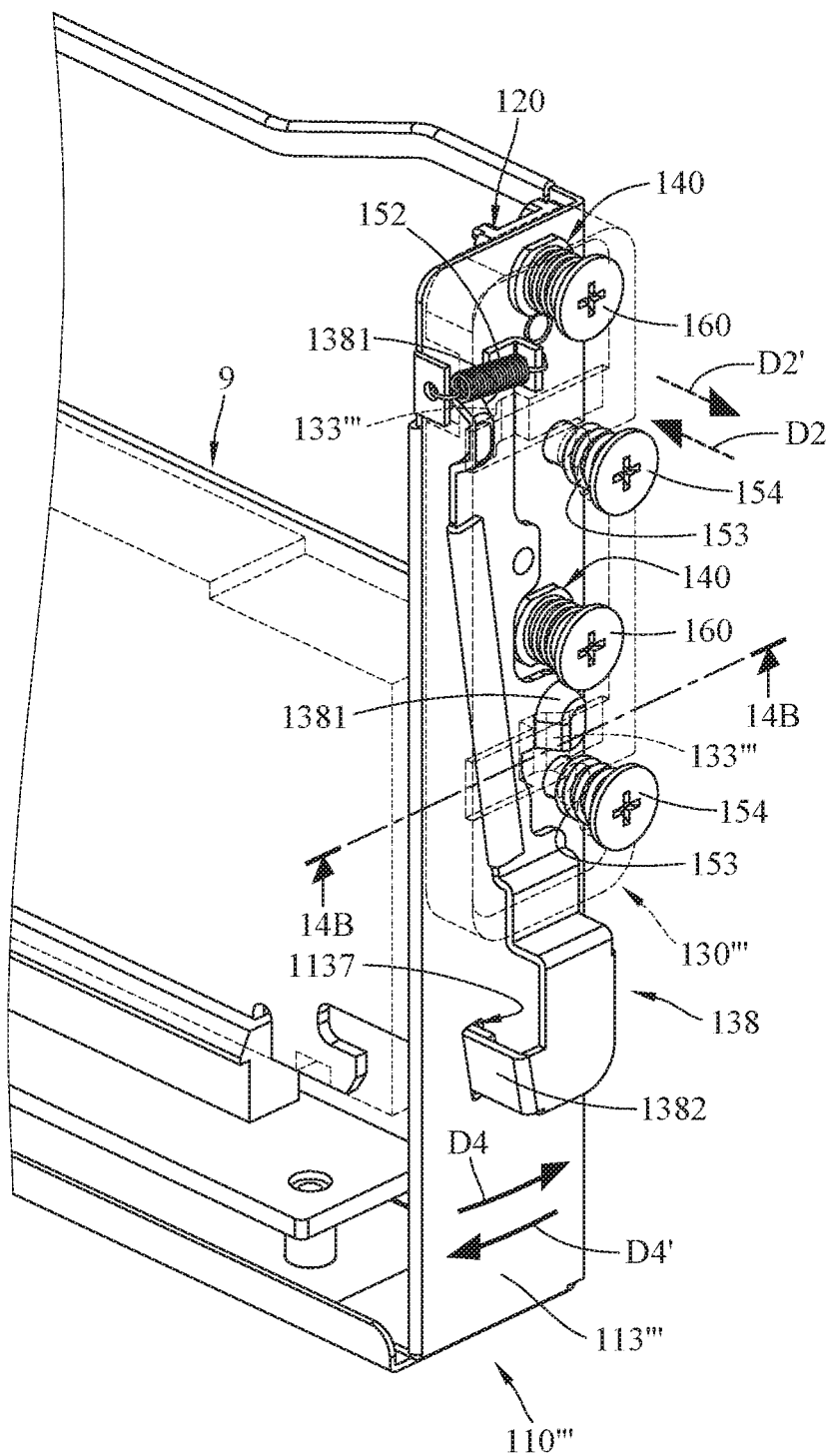
FIG. 14A is a partial enlarged perspective view of the cage in FIG. 13.
Figure 14B:
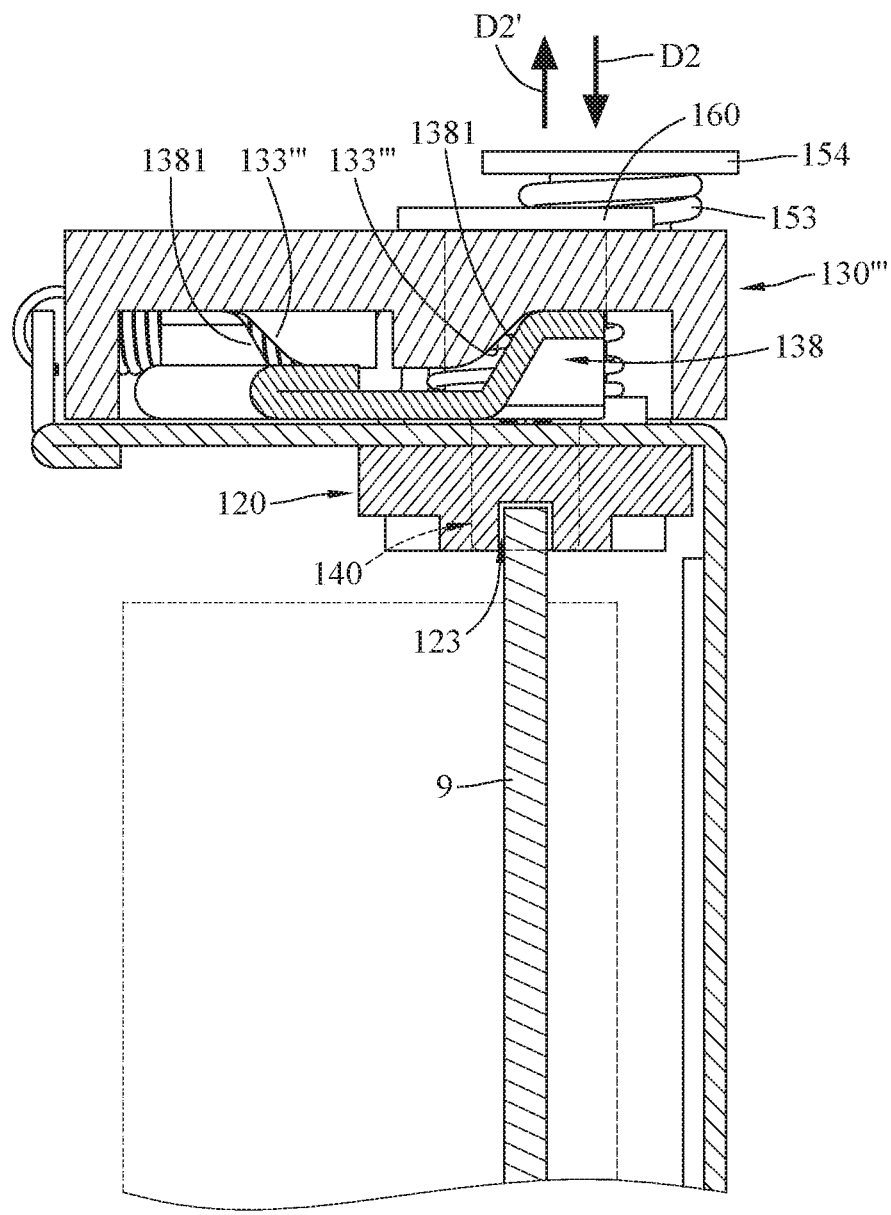
FIG. 14B is a partial enlarged cross-sectional view of the cage, taken along line 14B-14B in FIG. 14A.
Figure 15A:
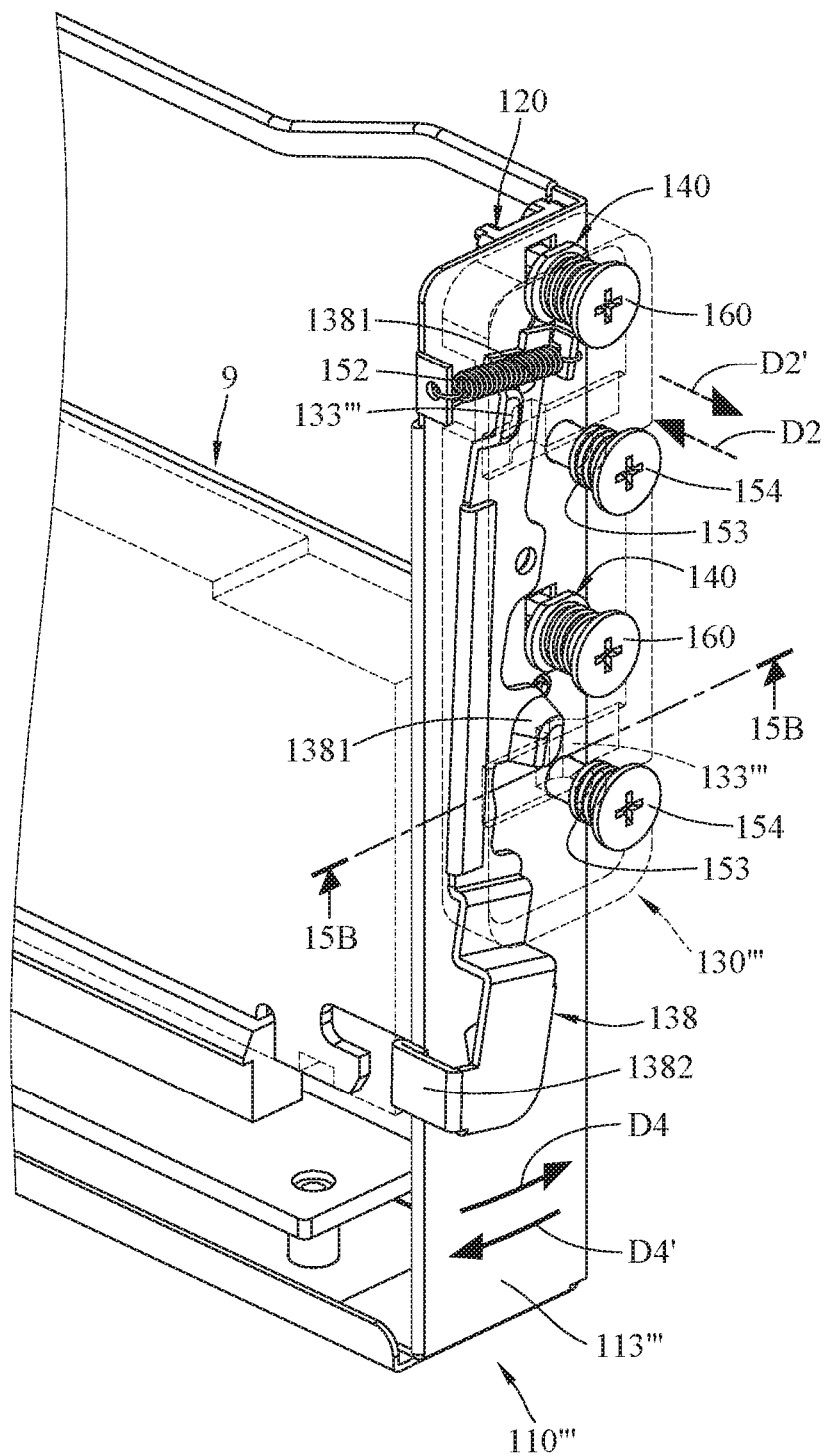
FIG. 15A is a partial enlarged cross-sectional perspective view of the cage in FIG. 14A when the operative component is switched to the releasing position.
Figure 15B:
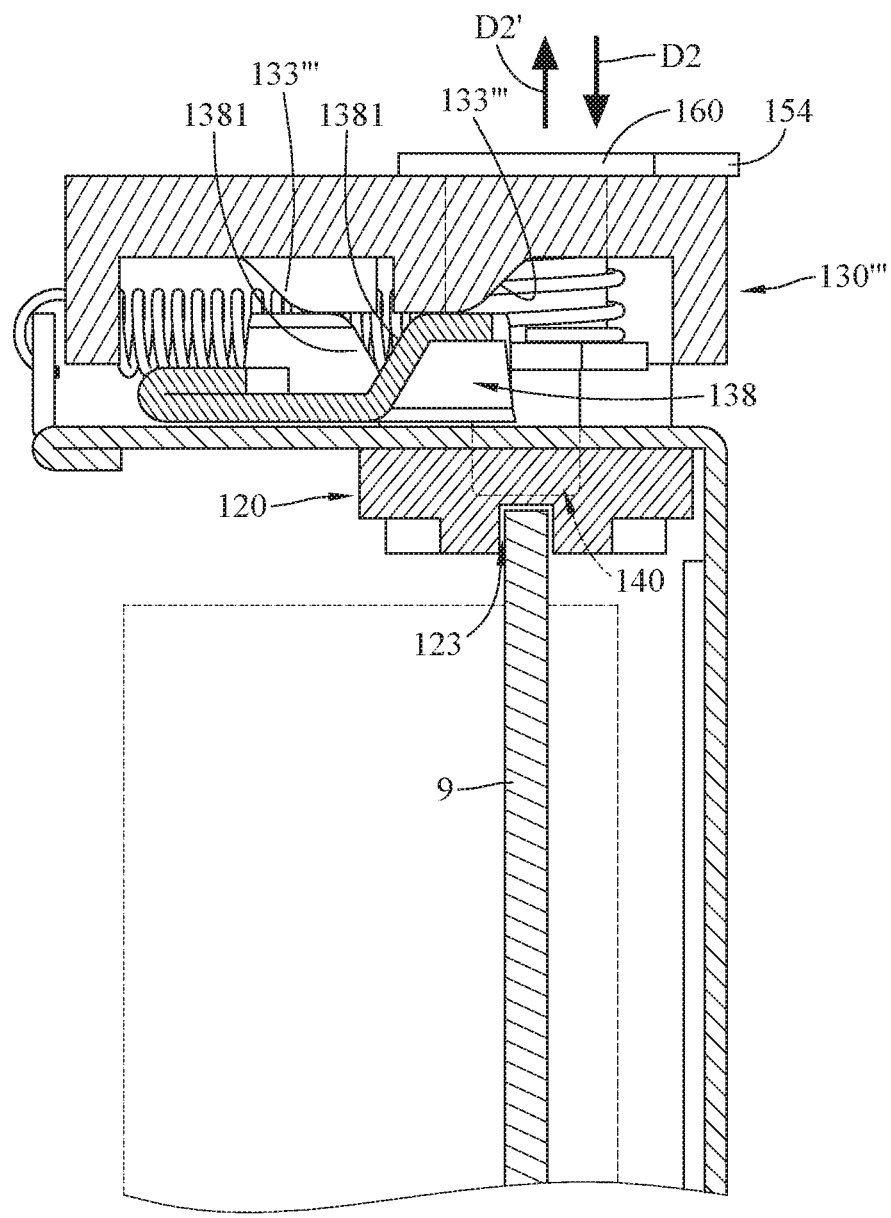
FIG. 15B is a partial enlarged cross-sectional view of the cage, taken along the line 15B-15B in FIG. 15A.

Alternatively, referring to FIGS. 13-15B, FIG. 13 is a partial enlarged exploded perspective view of a cage 1''' according to yet still another embodiment of the disclosure, FIG. 14A is a partial enlarged perspective view of the cage 1''' in FIG. 13, FIG. 14B is a partial enlarged cross-sectional view of the cage 1''' taken along line 14B-14B in FIG. 14A, FIG. 15A is a partial enlarged cross-sectional perspective view of the cage 1''' when an operative component 130''' is switched to the releasing position; and FIG. 15B is a partial enlarged cross-sectional view of the cage 1''' taken along the line 15B-15B in FIG. 15A.

Firstly, as shown in FIGS. 13-14B, in this embodiment, the operative component 130''' of the cage 1''' is movable along the direction D2 or D2' and disposed on a third plate portion 113''' of a cage body 110''', and there is a handle component 138 located between the operative component 130''' and the third plate portion 113''' and be pivotably fixed to the third plate portion 113''', the handle component 138 is pivotable about an axis AX relative to the third plate portion 113''' and the operative component 130''' (e.g., as indicated by the direction D4 or D4') so as to switch the operative component 130''' from the original position to the releasing position. Herein, in the original position (as shown in FIGS. 14A-14B), the operative component 130''' is located relatively closer to the third plate portion 113'''; in the releasing position (as shown in FIGS. 15A-15B), the operative component 130''' is located relatively away from the third plate portion 113'''. The second elastic component 152 is connected to the third plate portion 113''' and the handle component 138 so as to apply force to pull the handle component 138 back to its original position along the direction D4.

In addition, the operative component 130''' has a guide slot 131''' being a circular hole and configured to only allow the holder 140 and the fastener 160 to move with the operative component 130''' along the direction D2 or D2'. At least one inclined guiding surface 133''' of the operative component 130''' is formed at the inner surface of the operative component 130''' facing toward the cage body 110'''. Each of the inclined guiding surfaces 133''' gradually protrudes toward the rail 120 along a direction perpendicular to the moving direction of the operative component 130''' and the insertion/removal direction of the expansion card and therefore becomes a ramp relative to the flat inner face of the operative component 130'''. Correspondingly, the handle component 138 has at least one inclined contact surface 1381 formed at the surface of the handle component 138 facing toward the operative component 130''', each of the inclined contact surfaces 1381 gradually protrudes toward in a direction away from the rail 120 and perpendicular to the moving direction of the operative component 130''' and the insertion/removal direction of the expansion card, and the inclined contact surfaces 1381 are respectively corresponding to and configured to press against the inclined guiding surfaces 133'''.

As shown in FIGS. 15A-15B, when the handle component 138 is rotated in a specific direction (e.g., the direction D4'), the inclined contact surfaces 1381 can push the inclined guiding surfaces 133''' so as to force the operative component 130''' to move along a direction moving away from the cage body 110''' and the rail 120. This movement of the operative component 130''' can use the fasteners 160 thereon to move the holders 140 outwardly. Thus, the removal of the holders 140 from the groove 123 can be done by rotating the handle component 138.

In addition, in this embodiment, the cage 1''' further includes at least one third elastic component 153 and at least one pressing component 154, and the operative component 130''' further has at least one through hole 132. The pressing component 154 is, for example, a flat head screw that can be disposed through the through hole 132 of the operative component 130''' and screwed into the third plate portion 113''' of the cage body 110'''; alternatively, in some other embodiments, the pressing component 154 can be screwed to a post that protrudes into the through hole 132 from the third plate portion 113''' so as to be fixed with the third plate portion 113'''. The third elastic component 153 is, for example, a compression spring that can be clamped by the head part of the pressing component 154 and the surface of the operative component 130''' facing away from the third plate portion 113'''. As such, while the operative component 130''' is moved toward the releasing position and relatively away from the cage body 110''', the operative component 130''' and the pressing component 154 compress the third elastic component 153 so that the third elastic component 153 will store elastic potential energy that can be used to push the operative component 130''' toward the third plate portion 113''' so as to return it back to the original position.

Further, in this embodiment, the handle component 138 has a hook structure 1382 located at one end thereof. When the handle component 138 moves the operative component 130''' to the releasing position, the hook structure 1382 can hook on the top edge of the third plate portion 113''' so as to fix the handle component 138 in the current position, such that the operative component 130''' can be held in the releasing position by the handle component 138. This allows the user to insert/remove the expansion card without keeping holding the operative component 130'''. Moreover, the third plate portion 113''' has an engagement hole 1137; when the operative component 130''' is in the original position, the hook structure 1382 can be engaged in the engagement hole 1137 to fix the handle component 138 in the current position.

In this embodiment, when the hook structure 1382 of the handle component 138 is released from the top edge of the third plate portion 113''', the second elastic component 152 will immediately move the handle component 138 in the direction D4, such that the elastic potential energy of the third elastic component 153 can be released to push the operative component 130''' back to the original position. And the handle component 138 can be moved back to the position that the hook structure 1382 is engaged into the engagement hole 1137.

According to the cage and the electronic device as discussed in the above embodiments of the disclosure, the rail on the cage body of the cage only permits the expansion card moving along the groove while the holder that can stop the movement of the expansion card is arranged in the groove, such that the cage can provide multidirectional restrictions to the expansion card thereon so as to effectively prevent the expansion card from moving due to vibration or sudden impact, thereby ensuring the electrical connection of the expansion card.

As such, the cage is able to secure the position of the expansion card using a simple configuration that only involves simple operating steps and occupies a small space when operating.

Lastly, it is noted that the quantity of the expansion card that the cage of the disclosure can accommodate can be increased, and the quantities of the connector and the holders can be increased accordingly.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A cage, configured to accommodate at least one expansion card, the cage comprising:
   a cage body, configured to accommodate the at least one expansion card;

a rail, fixed on the cage body, wherein the rail has a groove configured for an insertion of the at least one expansion card;

at least one holder, movably disposed on the cage body, and part of the at least one holder removably located in the groove; wherein the at least one holder is configured to block the at least one expansion card in the groove; and at least one first elastic component, sleeved on part of the at least one holder to force the at least one holder to move toward the groove selectively.

2. The cage according to claim 1, wherein the rail is configured to allow the at least one expansion card to move along the groove, a moving direction of the at least one holder is at an angle to a moving direction of the at least one expansion card.

3. The cage according to claim 2, wherein the cage body has an insertion side for the insertion of the at least one expansion card into the cage body, the at least one holder has an inclined contact surface that is located at a side of the at least one holder facing toward the insertion side and is at an angle to the moving directions of the at least one expansion card and the at least one holder, and the inclined contact surface is configured for encountering the at least one expansion card.

4. The cage according to claim 1, wherein the at least one holder comprises a plurality of holders arranged along the groove and spaced apart from each other.

5. The cage according to claim 1, further comprising an operative component movably disposed on the cage body and having an original position and a releasing position, the at least one holder movably disposed on the operative component, wherein when the operative component is in the original position, the at least one holder is partially located in the groove; when the operative component is moved toward the releasing position, the operative component removes the at least one holder from the groove.

6. The cage according to claim 5, further comprising a second elastic component connected to the cage body and the operative component and configured to return the operative component back to the original position.

7. The cage according to claim 5, further comprising at least one fastener, wherein the operative component has at least one guide slot and at least one inclined guiding surface, the at least one inclined guiding surface is arranged along the at least one guide slot, the at least one fastener is movably inserted into the at least one guide slot and presses against the at least one inclined guiding surface, the at least one holder is disposed on the operative component via the at least one fastener so as to be movable with respect to the at least one guide slot with the at least one fastener, the at least one inclined guiding surface inclines in a direction away from the rail; when the operative component is moved toward the releasing position, the at least one inclined guiding surface of the operative component pushes the at least one fastener away from the rail so as to remove the at least one holder from the groove.

8. The cage according to claim 5, further comprising a pushing component connected to the operative component, wherein the cage body has an insertion side and a docking side located opposite to each other, the insertion side is configured for the insertion of the at least one expansion card into the cage body, the docking side is configured for an electrical connection to the at least one expansion card, the pushing component is movably located between the insertion side and the docking side; when the operative component is moved toward the releasing position, the operative component moves the pushing component toward the insertion side so that the pushing component pushes the at least one expansion card in a direction away from the docking side.

9. The cage according to claim 8, further comprising a transmission assembly disposed on the cage body, wherein the pushing component is movable by the operative component through the transmission assembly.

10. The cage according to claim 9, wherein the transmission assembly comprises a gear rack piece, a first gear, and a second gear, the pushing component comprises a gear rack portion, the gear rack piece is fixed to the operative component, the first gear and the second gear are pivotably disposed on the cage body, the first gear is engaged to the gear rack piece and the second gear, the second gear is engaged to the first gear and the gear rack portion; when the operative component is moved toward the releasing position, the transmission assembly cause the pushing component to move toward the insertion side.

11. The cage according to claim 5, wherein the operative component comprises a main portion, an engaging portion, and an elastic portion, the main portion is movably disposed on the cage body, the engaging portion is movably connected to the main portion via the elastic portion, the cage body has at least one engagement hole; when the operative component is in the releasing position, the engaging portion is removably inserted in the at least one engagement hole so as to fix the operative component in the releasing position.

12. The cage according to claim 5, further comprising a handle component pivotably disposed on the cage body and located between the cage body and the operative component, wherein the handle component is configured to move the operative component to the releasing position from the original position.

13. The cage according to claim 12, wherein the operative component has at least one inclined guiding surface located at a side of the operative component facing toward the handle component, the handle component has at least one inclined contact surface located at a side of the handle component facing toward the operative component, the at least one inclined contact surface is movably pressing against the at least one inclined guiding surface; when the handle component is rotated with respect to the cage body, the at least one inclined contact surface pushes the at least one inclined guiding surface so as to move the operative component away from the rail to move the operative component toward the releasing position.

14. The cage according to claim 13, wherein the handle component further comprises a hook structure; when the handle component causes the operative component to reach the releasing position, the hook structure hooks on the cage body so as to fix the handle component in position.

15. The cage according to claim 13, further comprising a second elastic component, wherein the second elastic component is connected to the cage body and the handle component and configured to force the at least one inclined contact surface of the handle component to move away from the at least one inclined guiding surface of the operative component.

16. The cage according to claim 1, further comprising at least one connector configured for electrically connecting to the at least one expansion card, wherein the cage body comprises a first plate portion, a second plate portion, a third plate portion, and a fourth plate portion, the second plate portion, the third plate portion, and the fourth plate portion are respectively connected to different sides of the first plate portion, the second plate portion is connected between the third plate portion and the fourth plate portion, the first plate portion, the third plate portion, and the fourth plate portion together form an opening configured for the insertion of the at least one expansion card into the cage body, the at least one connector is disposed on the second plate portion, the rail is fixed on the third plate portion, and the at least one holder is movably disposed through the third plate portion.

17. An electronic device, configured to accommodate at least one expansion card, the electronic device comprising:
 a casing; and
 at least one cage, comprising:
  a cage body, disposed in the casing and configured to accommodate the at least one expansion card;
  a rail, fixed on the cage body, wherein the rail has a groove configured for an insertion of the at least one expansion card;
  at least one holder, movably disposed on the cage body, part of the at least one holder removably located in the groove; wherein the at least one holder is configured to block the at least one expansion card in the groove; and
  at least one first elastic component, sleeved on part of the at least one holder to force the at least one holder to move toward the groove selectively.

18. The electronic device according to claim 17, wherein the at least one cage further comprises an operative component movably disposed on the cage body and having an original position and a releasing position, the at least one holder is movably disposed on the operative component; when the operative component is in the original position, the at least one holder is partially located in the groove; when the operative component is moved toward the releasing position, the operative component removes the at least one holder from the groove.

19. The electronic device according to claim 18, wherein the at least one cage further comprises a second elastic component connected to the cage body and the operative component and configured to force the operative component to move back to the original position.

20. The electronic device according to claim 18, wherein the at least one cage further comprises a pushing component connected to the operative component and configured to push the at least one expansion card along a removal direction of the at least one expansion card.

21. The electronic device according to claim 18, wherein the at least one cage further comprises a handle component pivotably disposed on the cage body and located between the cage body and the operative component, and the handle component is configured to move the operative component to the releasing position from the original position.

* * * * *